US012690436B2

(12) United States Patent
Lee et al.

(10) Patent No.: US 12,690,436 B2
(45) Date of Patent: Jul. 21, 2026

(54) SEMICONDUCTOR INTERCONNECTION STRUCTURES AND METHODS OF FORMING THE SAME

(71) Applicant: TAIWAN SEMICONDUCTOR MANUFACTURING COMPANY, LTD., Hsinchu (TW)

(72) Inventors: Cheng-Chin Lee, Hsinchu (TW); Ting-Ya Lo, Hsinchu (TW); Hsiao-Kang Chang, Hsinchu (TW); Hsin-Yen Huang, Hsinchu (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 669 days.

(21) Appl. No.: 18/106,623

(22) Filed: Feb. 7, 2023

(65) Prior Publication Data

US 2023/0178427 A1 Jun. 8, 2023

Related U.S. Application Data

(63) Continuation-in-part of application No. 17/698,743, filed on Mar. 18, 2022, now Pat. No. 12,272,597.

(Continued)

(51) Int. Cl.
*H10W 20/00* (2026.01)
*H10P 50/28* (2026.01)
(Continued)

(52) U.S. Cl.
CPC ....... *H10W 20/098* (2026.01); *H10W 20/034* (2026.01); *H10W 20/072* (2026.01); *H10W 20/076* (2026.01); *H10W 20/084* (2026.01);

*H10W 20/42* (2026.01); *H10W 20/46* (2026.01); *H10W 20/47* (2026.01); *H10P 50/283* (2026.01);
(Continued)

(58) Field of Classification Search
CPC ......... H01L 21/76837; H01L 21/76807; H01L 21/7682; H01L 21/76831; H01L 21/76844; H01L 23/5226; H01L 23/53295; H01L 21/31116; H01L 21/31122; H01L 21/31138; H01L 21/76849; H01L 21/76883; H01L 2221/1036; H01L 21/76832; H01L 21/76826; H01L 21/0228; H01L 21/3105; H01L 21/32; H01L 21/321; H01L 21/76885; H01L 2221/1063; H01L 21/76834; H01L 23/5222
See application file for complete search history.

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

WO WO-2016209207 A1 * 12/2016 ............. B81B 7/007

*Primary Examiner* — Douglas W Owens
(74) *Attorney, Agent, or Firm* — NZ Carr Law Office

(57) ABSTRACT

An interconnection structure is provided. The interconnection structure includes an etching-process-free first dielectric layer, a first conductive structure extending within the first dielectric layer, a second dielectric layer formed under the first dielectric layer, and a second conductive structure extending through both the first dielectric layer and the second conductive layer.

20 Claims, 26 Drawing Sheets

700

Related U.S. Application Data

(60) Provisional application No. 63/212,002, filed on Jun. 17, 2021.

(51) Int. Cl.
    *H10W 20/42*       (2026.01)
    *H10W 20/46*       (2026.01)
    *H10W 20/47*       (2026.01)

(52) U.S. Cl.
    CPC .......... *H10P 50/285* (2026.01); *H10P 50/287* (2026.01); *H10W 20/037* (2026.01); *H10W 20/056* (2026.01); *H10W 20/0888* (2026.01)

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2011/0221062 A1* | 9/2011 | Clevenger | H01L 21/02126 257/E21.585 |
| 2016/0284593 A1* | 9/2016 | Yang | H01L 21/7682 |
| 2016/0329237 A1* | 11/2016 | Chen | H01L 21/7682 |
| 2019/0237356 A1* | 8/2019 | Srivastava | H01L 23/5226 |
| 2022/0013403 A1* | 1/2022 | Tien | H01L 21/7682 |
| 2022/0165617 A1* | 5/2022 | Luo | H01L 23/53209 |

* cited by examiner

300

300

300

300

300

300

300

300

400

400

400

400

400

100

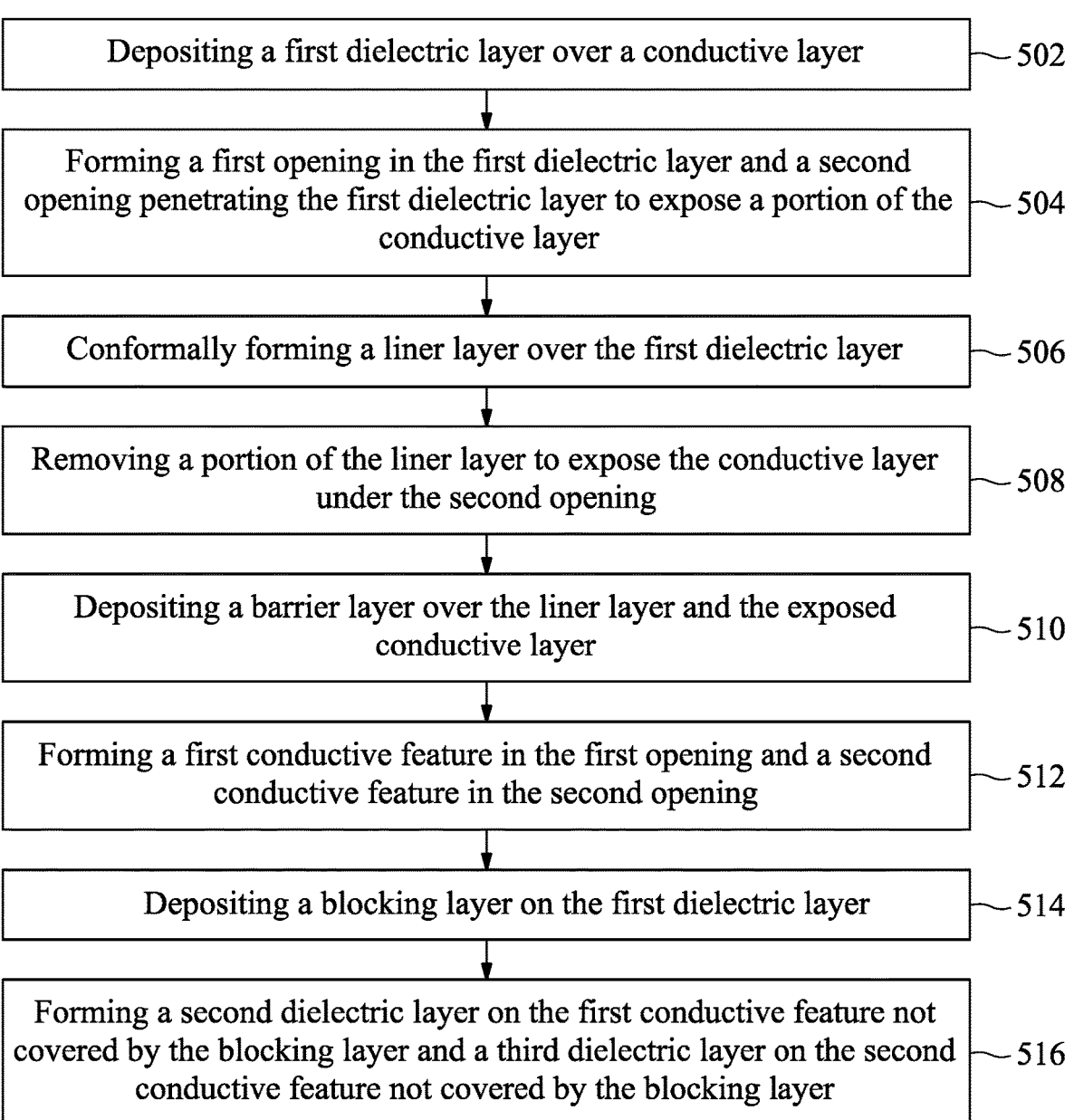

500

Depositing a first dielectric layer over a conductive layer ~502

Forming a first opening in the first dielectric layer and a second opening penetrating the first dielectric layer to expose a portion of the conductive layer ~504

Conformally forming a liner layer over the first dielectric layer ~506

Removing a portion of the liner layer to expose the conductive layer under the second opening ~508

Depositing a barrier layer over the liner layer and the exposed conductive layer ~510

Forming a first conductive feature in the first opening and a second conductive feature in the second opening ~512

Depositing a blocking layer on the first dielectric layer ~514

Forming a second dielectric layer on the first conductive feature not covered by the blocking layer and a third dielectric layer on the second conductive feature not covered by the blocking layer ~516

Fig. 5

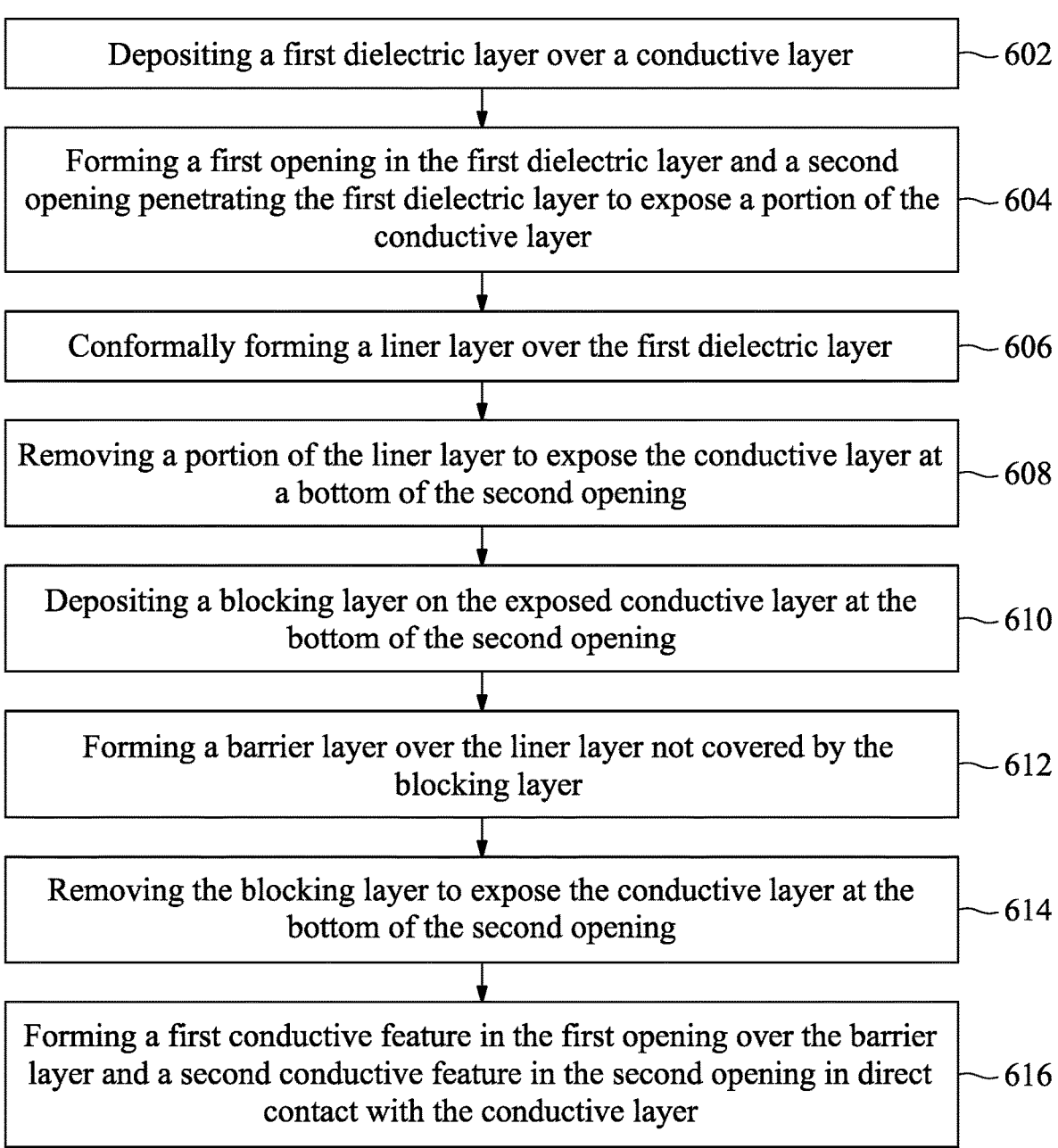

600

Depositing a first dielectric layer over a conductive layer — 602

Forming a first opening in the first dielectric layer and a second opening penetrating the first dielectric layer to expose a portion of the conductive layer — 604

Conformally forming a liner layer over the first dielectric layer — 606

Removing a portion of the liner layer to expose the conductive layer at a bottom of the second opening — 608

Depositing a blocking layer on the exposed conductive layer at the bottom of the second opening — 610

Forming a barrier layer over the liner layer not covered by the blocking layer — 612

Removing the blocking layer to expose the conductive layer at the bottom of the second opening — 614

Forming a first conductive feature in the first opening over the barrier layer and a second conductive feature in the second opening in direct contact with the conductive layer — 616

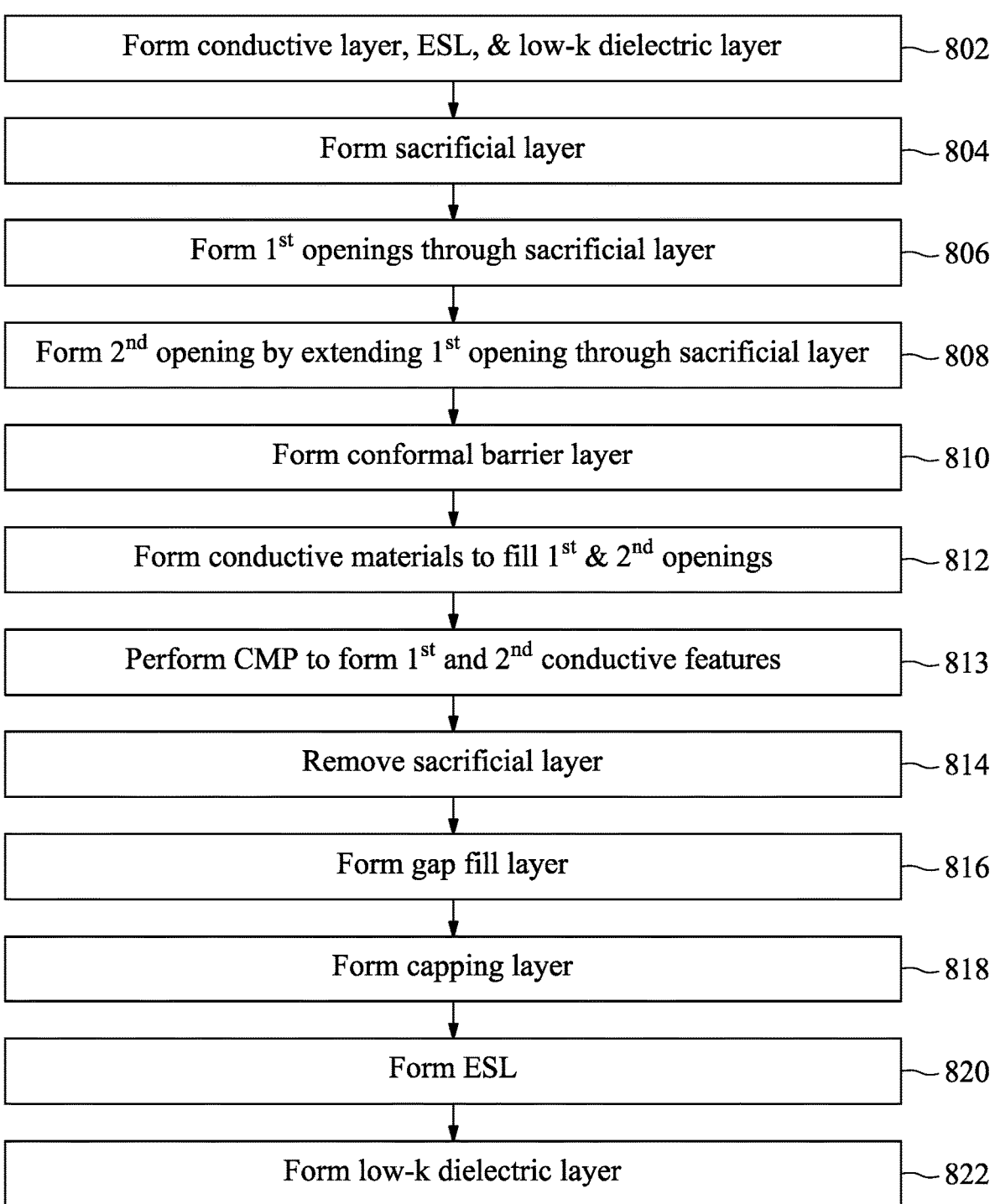

| | |
|---|---|
| Form conductive layer, ESL, & low-k dielectric layer | ~802 |
| Form sacrificial layer | ~804 |
| Form 1st openings through sacrificial layer | ~806 |
| Form 2nd opening by extending 1st opening through sacrificial layer | ~808 |
| Form conformal barrier layer | ~810 |
| Form conductive materials to fill 1st & 2nd openings | ~812 |
| Perform CMP to form 1st and 2nd conductive features | ~813 |
| Remove sacrificial layer | ~814 |
| Form gap fill layer | ~816 |
| Form capping layer | ~818 |
| Form ESL | ~820 |
| Form low-k dielectric layer | ~822 |

SEMICONDUCTOR INTERCONNECTION STRUCTURES AND METHODS OF FORMING THE SAME

CROSS REFERENCE

This application is a continuation-in-part of U.S. patent application Ser. No. 17/698,743 entitled "Semiconductor Interconnection Structures and Methods of Forming the Same," filed Mar. 18, 2022, which claims priority to US Provisional Application Ser. No. 63/212,002 filed Jun. 17, 2021, which are incorporated by reference in their entirety.

BACKGROUND

As the semiconductor industry introduces new generations of integrated circuits (IC) having higher performance and more functionality, the density of the elements forming the ICs increases, while the dimensions, sizes and spacing between components or elements are reduced. The semiconductor industry continues to improve the integration density of various electronic components (e.g., transistors, diodes, resistors, capacitors, etc.) by continual reductions in minimum feature size, which allow more components to be integrated into a given area.

For manufacturing different conductive layers on the substrate, various structures and manufacturing methods are utilized to form the interconnection structures between conductive layers. However, the integrated fabrication also brings out some issues, such as reliability, high capacitance, or high resistance. Therefore, there is a need in the art to provide improved devices or methods that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a flow chart of a method for manufacturing a semiconductor interconnection structure in accordance with some embodiments.

FIG. 6 is a flow chart of another method for manufacturing a semiconductor interconnection structure in accordance with some embodiments.

FIG. 8 is a flow chart of a method for manufacturing a semiconductor interconnection structure in accordance with some embodiments.

DETAILED DESCRIPTION

Figures 1, 2A, 2B:
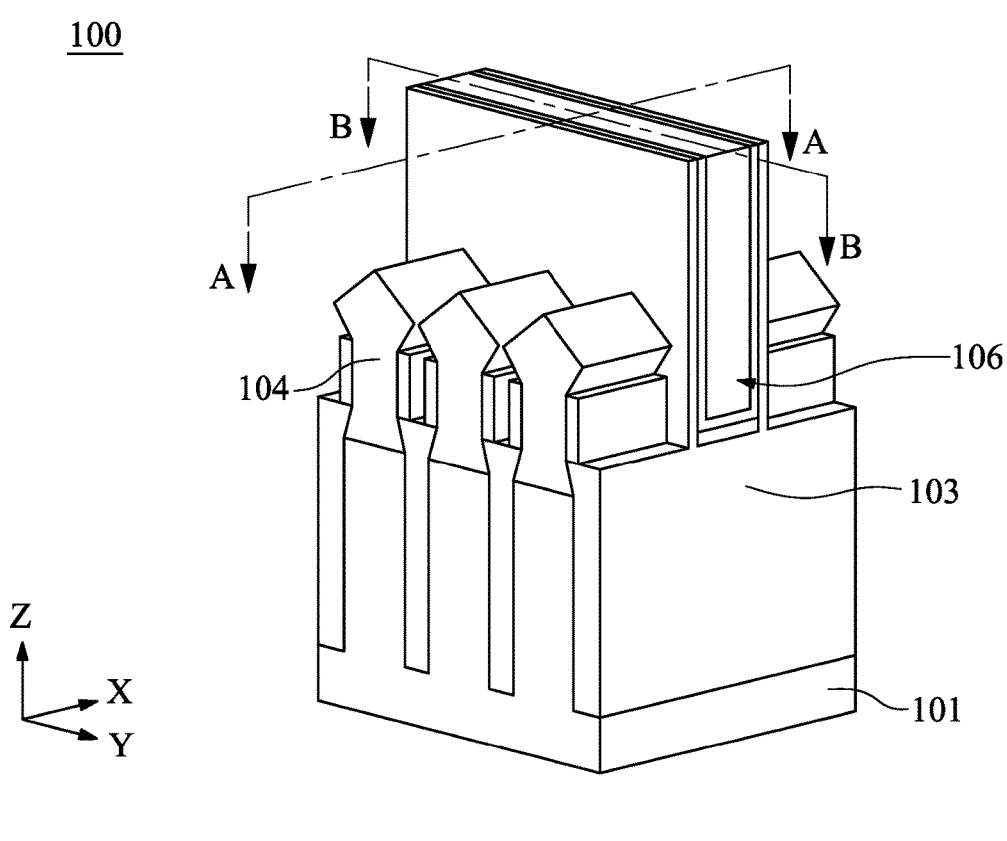
FIG. 1 is a perspective view of one of the various stages of manufacturing a semiconductor device structure, in accordance with some embodiments.
FIGS. 2A-2B are cross-sectional side views of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a perspective view of one of the various stages of manufacturing a semiconductor device structure 100, in accordance with some embodiments. As shown in FIG. 1, the semiconductor device structure 100 includes a substrate 101 having at least a plurality of devices formed thereover. The devices, such as transistors, diodes, imaging sensors, resistors, capacitors, inductors, memory cells, a combination thereof, and/or other suitable devices, may be formed on the substrate 101. In some embodiments, the interconnection structures may be formed on or below the devices.

FIGS. 2A-2B are cross-sectional side views of various stages of manufacturing the semiconductor device structure 100, in accordance with some embodiments. FIG. 2A is a cross-sectional side view of the semiconductor device structure 100 taken along line A-A of FIG. 1, and FIG. 2B is a cross-sectional side view of the semiconductor device structure 100 taken along line B-B of FIG. 1. The line A-A of FIG. 1 extends along a direction that is substantially perpendicular to the longitudinal direction of a gate stack 106, and the line B-B of FIG. 1 extends along the longitudinal direction of the gate stack 106. As shown in FIGS. 2A and 2B, the semiconductor device structure 100 includes the substrate 101, and one or more devices 102 are formed on the substrate 101. The interconnection structures may be formed over the devices 102.

The substrate 101 may be a semiconductor substrate. In some embodiments, the substrate 101 includes a crystalline semiconductor layer on at least the surface of the substrate 101. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). In some embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxygen-containing material, such as an oxide.

The substrate 101 may include various regions that have been suitably doped with impurities (e.g., p-type or n-type impurities). The dopants are, for example phosphorus for an n-type fin field effect transistor (FinFET) and boron for a p-type FinFET.

As described above, the devices 102 may be any suitable devices, such as transistors, diodes, imaging sensors, resistors, capacitors, inductors, memory cells, or a combination thereof. In some embodiments, the devices 102 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 102 formed between the substrate 101 and the interconnection structures (such as the interconnection structure 200 shown in FIG. 3A-3L or 4A-4D) may be a FinFET or a nanostructure, which is shown in FIGS. 2A and 2B. An exemplary device 102 may include source/drain (S/D) regions 104 and a gate stack 106 disposed between the S/D regions 104 serving as source regions and the S/D regions 104 serving as drain regions. S/D region(s) may refer to a source or a drain, individually or collectively dependent upon the context. While there is only one gate stack 106 formed on the substrate 101, it is contemplated that two or more gate stacks 106 may also be formed on the substrate 101. Channel regions 108 are formed between the S/D regions 104 serving as source regions and the S/D regions 104 serving as drain regions.

The S/D regions 104 may include a semiconductor material, such as Si or Ge, a III-V compound semiconductor, an II-VI compound semiconductor, or other suitable semiconductor material. Exemplary S/D region 104 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 104 may include p-type dopants, such as boron; n-type dopants, such as phosphorus or arsenic; and/or other suitable dopants including combinations thereof. The S/D regions 104 may be formed by an epitaxial growth method using CVD, atomic layer deposition (ALD) or molecular beam epitaxy (MBE). The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 101. In some embodiments, the devices 102 are FinFETs, and the channel regions 108 are a plurality of fins each having at least three surfaces wrapped around by the gate stack 106. In some other embodiments, the devices 102 are nanosheet transistors, and the channel regions 108 include two or more nanosheets surrounded by the gate stack 106.

Each gate stack 106 includes a gate electrode layer 110 disposed over the channel region 108 or partially/fully surrounding the channel region 108. The gate electrode layer 110 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 106 may include an interfacial dielectric layer 112, a gate dielectric layer 114 disposed on the interfacial dielectric layer 112, and one or more conformal layers 116 disposed on the gate dielectric layer 114. The gate electrode layer 110 may be disposed on the conformal layers 116. The interfacial dielectric layer 112 may include a dielectric material, such as an oxygen-containing material or a nitrogen-containing material, or multilayers thereof, and may be formed by any suitable deposition method, such as CVD, PECVD, or ALD. The gate dielectric layer 114 may include a dielectric material such as an oxygen-containing material or a nitrogen-containing material, a high-k dielectric material having a k value greater than that of silicon dioxide, or multilayers thereof. The gate dielectric layer 114 may be formed by any suitable method, such as CVD, PECVD, or ALD. The conformal layers 116 may include one or more barrier layers and/or capping layers, such as a nitrogen-containing material, for example tantalum nitride (TaN), titanium nitride (TiN), or the like. The conformal layers 116 may further include one or more work-function layers, such as aluminum titanium carbide, aluminum titanium oxide, aluminum titanium nitride, or the like. The term "conformal" may be used herein for ease of description upon a layer having substantial same thickness over various regions. The conformal layers 116 may be deposited by ALD, PECVD, MBD, or any suitable deposition technique.

One or more gate spacers 118 are formed along sidewalls of the gate stack 106 (e.g., sidewalls of the gate dielectric layers 114). The gate spacers 118 may include silicon oxycarbide, silicon nitride, silicon oxynitride, silicon carbon nitride, the like, multi-layers thereof, or a combination thereof, and may be deposited by CVD, PVD, ALD, or other suitable deposition technique.

Portions of the gate stacks 106 and the gate spacers 118 may be formed on isolation regions 103. The isolation regions 103 are formed on the substrate 101. The isolation regions 103 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, the isolation regions 103 includes silicon oxide that is formed by a FCVD process.

A contact etch stop layer (CESL) 124 is formed on a portion of the S/D regions 104 and the isolation region 103, and a first interlayer dielectric (ILD) 126 is formed on the CESL 124. The CESL 124 can provide a mechanism to stop an etch process when forming openings in the first ILD 126. The CESL 124 may be conformally deposited on surfaces of the S/D regions 104 and the isolation regions 103. The CESL 124 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, PVD, ALD, or any suitable deposition technique. The first ILD 126 may include an oxide formed by tetraethylorthosilicate (TEOS), un-doped silicate glass, or doped silicon oxide such as boro-phosphosilicate glass (BPSG), fused silica glass (FSG), phosphosilicate glass (PSG), boron doped silicon glass (BSG), organosilicate glass (OSG), SiOC, and/or any suit-able low-k dielectric materials (e.g., a material having a dielectric constant lower than silicon dioxide), and may be deposited by spin-on, CVD, FCVD, PECVD, PVD, or any suitable deposition technique.

A silicide layer 120 is formed on at least a portion of each S/D region 104, as shown in FIGS. 2A and 2B. The silicide layer 120 may include a material having one or more of WSi, CoSi, NiSi, TiSi, MoSi and TaSi. In some embodiments, the silicide layer 120 includes a metal or metal alloy silicide, and the metal includes a noble metal, a refractory metal, a rare earth metal, alloys thereof, or combinations thereof. A conductive contact 122 is disposed on each silicide layer 120. The conductive contact 122 may include a material having one or more of Ru, Mo, Co, Ni. W, Ti, Ta, Cu, Al, TiN or TaN, and the conductive contact 122 may be formed by any suitable method, such as electro-chemical plating (ECP), or PVD. The silicide layer 120 and the conductive contact 122 may be formed by first forming an opening in the first ILD 126 and the CESL 124 to expose at least a portion of the S/D region 104, then forming the silicide layer 120 on the exposed portion of the S/D region 104, and then forming conductive contact 122 on the silicide layer 120.

FIGS. 3A-3L are cross-sectional side views of various stages of manufacturing a semiconductor structure 300, including an interconnection structure 301, in accordance with some embodiments. In some embodiments, the inter-connection structure 301 may be formed on or below the semiconductor device structure 100. FIG. 5 is a flow chart of a method 500 for manufacturing the interconnection struc-ture 301 in accordance with some embodiments. For the purpose of better describing the present disclosure, the cross-sectional side view of the semiconductor structure 300 in FIGS. 3A-3L and the method 500 in FIG. 5 will be discussed together. It is understood that the operations shown in the method 500 are not exhaustive and that other operations may be performed as well before, after, or between any of the illustrated operations. Further, some of the operations may be performed simultaneously, or in a different order than shown in FIGS. 3A-3L and FIG. 5.

Figure 3A:
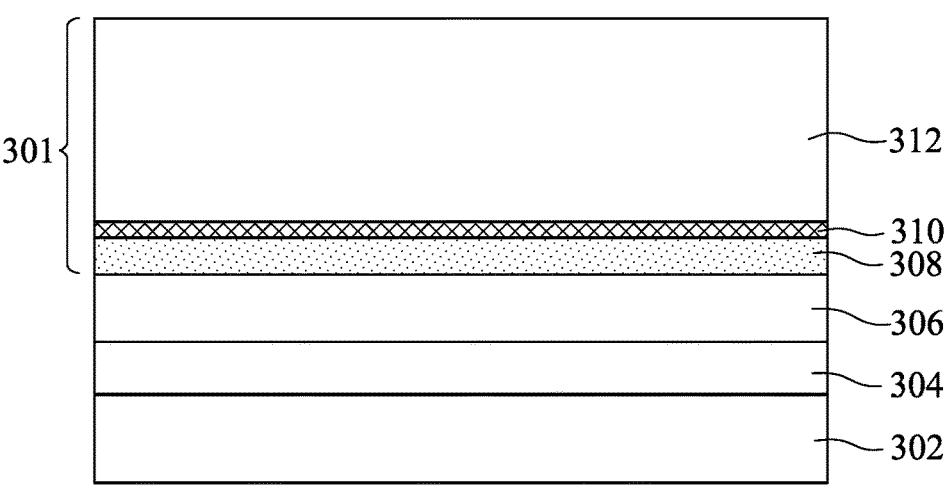
FIGS. 3A-3L are cross-sectional side views of various stages of manufacturing a semiconductor structure, in accordance with some embodiments.

As shown in FIG. 3A, a semiconductor substrate 302 is provided. The semiconductor substrate 302 may be similar to substrate 101 discussed above. A plurality of devices 304 and a middle end of the line (MEOL) structure 306 may be formed on the semiconductor substrate 302. In some embodiments, the plurality of devices 304 may be the devices 102 shown in FIGS. 2A and 2B.

In the MEOL structure 306, low level interconnects (contacts), such as the conductive contacts 122 shown in FIGS. 2A and 2B, are formed over the S/D regions 104 and the gate electrode layer 110. The MEOL structure 306 may have smaller critical dimensions and may be spaced closer together compared to a later formed back end of the line (BEOL) counterparts. A purpose of the contact layers of the MEOL structure 306 is to electrically connect the various regions of the transistors, i.e., the source/drain and metal gate electrode, to higher level interconnects in the BEOL.

As shown in FIG. 3A and operation 502 in FIG. 5, a conductive layer 308 is formed over the MEOL structure 306, an etch stop layer (ESL) 310 may be formed over the conductive layer 308, and a dielectric layer 312 is formed over the ESL 310. In some embodiments, the conductive layer 308 may be a conductive layer of other interconnection structures of the semiconductor structure 300. In some embodiments, the conductive layer 308 may be a conductive layer above the MEOL structure 306. In some embodiments, the conductive layer 308 may include Cu, Al, CuAl, Ru, Mo, W, and related alloys formed in a dielectric material (not shown). In some embodiments, the conductive layer 308 may be formed by ALD, CVD, PVD, electroless deposition (ELD), ECP, or other suitable processes.

In some embodiments, the ESL 310 may be used to control the etching depth in the dielectric layer 312 and serve as an etch stop when forming a later formed conductive feature in the dielectric layer 312. In some embodiments, the ESL 310 may include SiNx, SiCxNy, AlNx, AlOx, AOxNy, SiOx, SiCx, SiOxCy, or other suitable materials. In some embodiments, the ESL 310 may be formed by CVD, PVD, ALD, spin coating, or other suitable processes. In some embodiments, the dielectric layer 312 may include or be made of porous SiCOH, dense SiCOH, BN, BC, or other suitable materials. In some embodiments, the dielectric layer 312 may formed by PECVD, ALD, PVD, or other suitable processes.

Figure 3B:
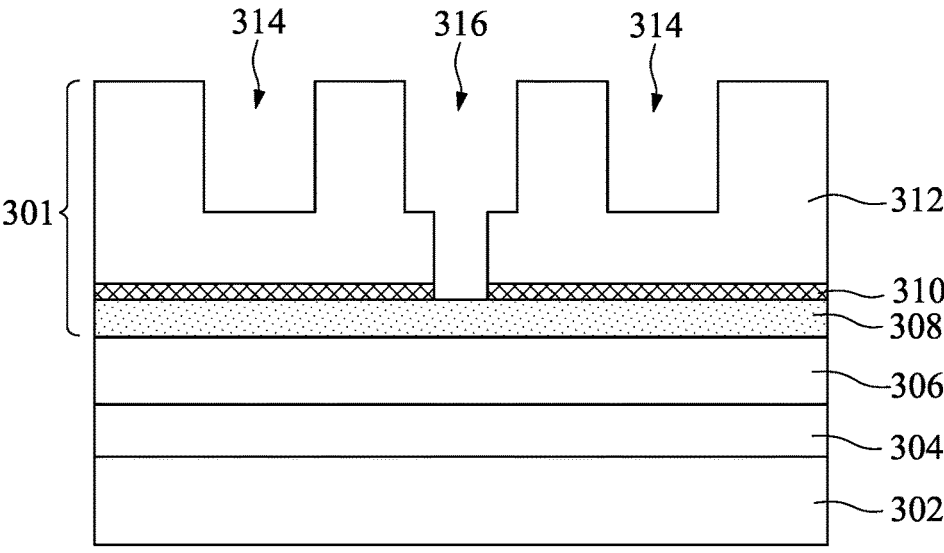

As shown in FIG. 3B and operation 504 in FIG. 5, a first opening 314 and a second opening 316 are formed in the dielectric layer 312. The first opening 314 is formed in the dielectric layer 312, and the second opening 316 penetrates the dielectric layer 312 to expose a portion of the conductive layer 308. In some embodiments, the first opening 314 and the second opening 316 may be formed by dry etch, wet etch, or other suitable processes. In some embodiments, the first opening 314 may include a trench formed in the dielectric layer 312. In some embodiments, the second opening 316 may include a via and a trench formed sequen-tially in the dielectric layer 312 to expose a portion of the conductive layer 308. In some embodiments, the trench of the first opening 314 and the trench of the second opening 316 may be formed first, and then the via of the second opening 316 may be formed under the trench of the second opening 316 to expose a portion of the conductive layer 308. In some embodiments, the via of the second opening 316 may be formed first penetrating the dielectric layer 312 and the ESL 310 to expose a portion of the conductive layer 308, and the trench of the first opening 314 and the trench of the second opening 316 may be formed thereafter.

Figure 3C:
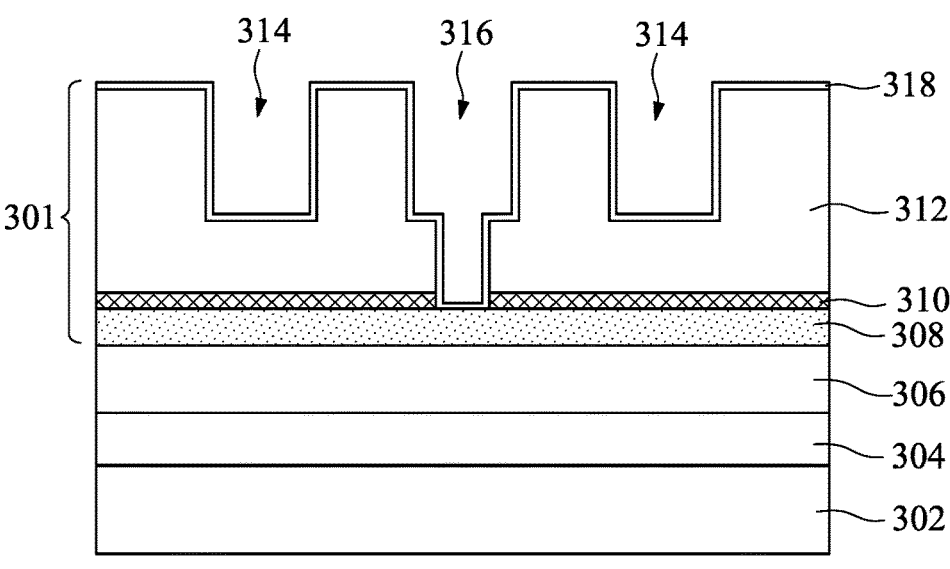

As shown in FIG. 3C and operation 506 in FIG. 5, a liner layer 318 is conformally formed over the dielectric layer 312. The liner layer 318 may cover the top surface of the dielectric layer 312, the first opening 314, and the second opening 316 including the exposed surface of the conductive layer 308. In some embodiments, the liner layer 318 may include metal oxide, metal nitride, silicon oxide doped carbide (ODS), or other suitable materials. In some embodi-ments, the liner layer 318 may include AlOx, ZrOx, YOx, AlNx, TiNx, SiNx, SiCxNy, ODS, or other suitable materi-als. In some embodiments, the liner layer 318 may have a thickness between 5 Angstroms and 40 Angstroms. In some embodiments, the liner layer 318 may be formed by PECVD, ALD, PVD, or other suitable processes. The liner layer 318 may prevent the damage on sidewalls of the later formed barrier layer or conductive materials during a later etch process.

Figure 3D:
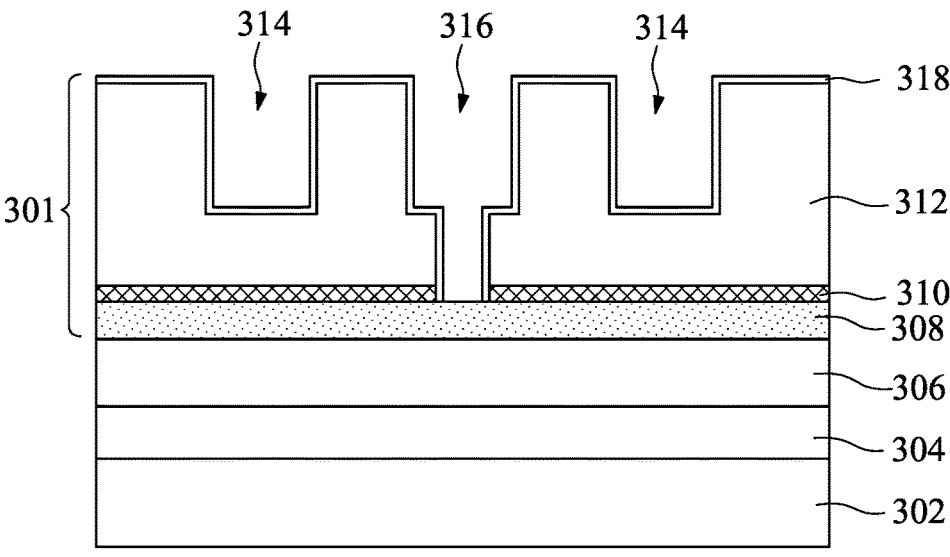

As shown in FIG. 3D and operation 508 in FIG. 5, a portion of the liner layer 318 that covers the conductive layer 308 is removed. In other words, the liner layer 318 at the bottom of the opening 316 is removed to expose the con-ductive layer 308. In some embodiments, the removal of the portion of the liner layer 318 may be performed by dry etch, or other suitable processes.

Figure 3E:
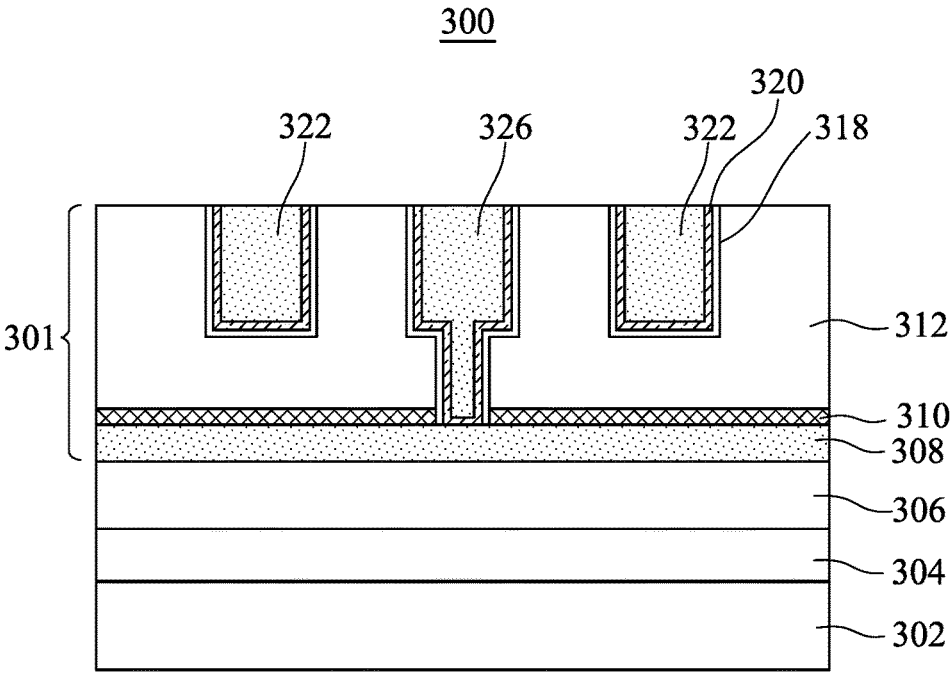

Then, as shown in FIG. 3E and operation 510 in FIG. 5, a barrier layer 320 is deposited over the liner layer 318 and the exposed conductive layer 308. In some embodiments, the barrier layer 320 may be conformally formed over the liner layer 318. In other words, the barrier layer 320 may cover not only the liner layer 318 but also the exposed conductive layer 308 at the bottom of the second opening 316. In some embodiments, the barrier layer 320 may include TaN, TiN, or other suitable materials. In some embodiments, the barrier layer 320 may have a thickness between 10 Angstroms and 30 Angstroms. In some embodiments, the barrier layer 320 may be formed by thermal ALD, or other suitable processes.

Then, as shown in FIG. 3E and operation 512 in FIG. 5, a first conductive feature 322 is formed in the first opening 314, and a second conductive feature 326 is formed in the second opening 316. A conductive material may be deposited over the barrier layer 320 and fills the first opening 314 and the second opening 316. Then, a planarization operation, e.g., chemical mechanical polishing (CMP), may be performed so that the first conductive feature 322 and the second conductive feature 326 are formed, as shown in FIG. 3E.

In some embodiments, the first conductive feature 322 and the second conductive feature 326 may include Cu, Al, CuAl, Ru, Mo, W, and related alloys. In some embodiments, the first conductive feature 322 and the second conductive feature 326 may be formed by ALD, CVD, PVD, ELD, ECP, or other suitable processes. The liner layer 318 is disposed between the first conductive feature 322 and the dielectric layer 312 and between the second conductive feature 326 and the dielectric layer.

Figure 3F:
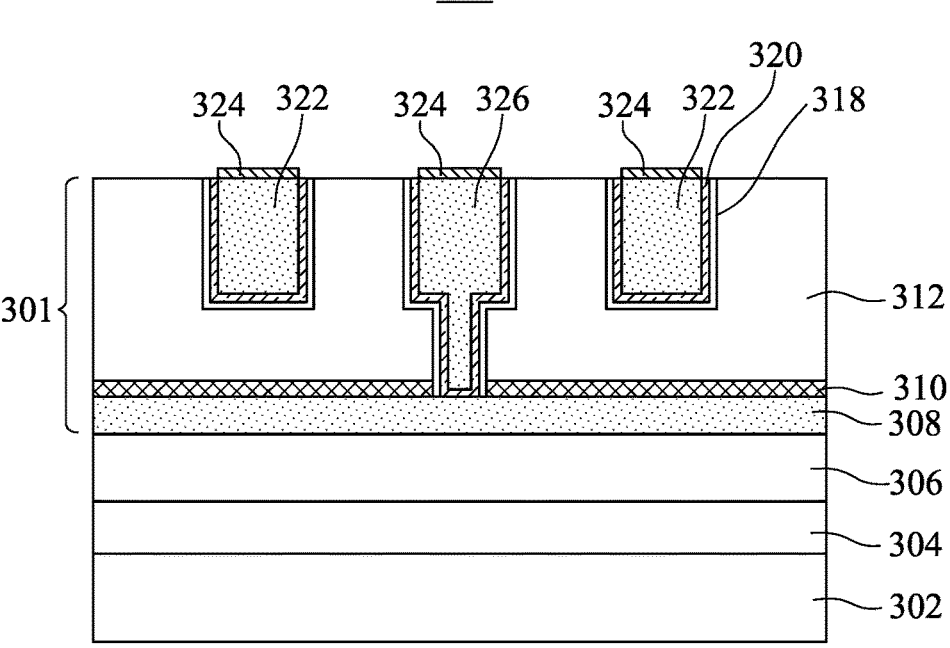

Then, as shown in FIG. 3F, a capping layer 324 is formed on the first conductive feature 322 and the second conductive feature 326. In some embodiments, the capping layer 324 may include Cobalt (Co), or other suitable materials. In some embodiments, the capping layer 324 may be formed by CVD, ALD, or other suitable processes.

In some embodiments, the capping layer 324 is selectively formed on the first conductive feature 322 and the second conductive feature 326 but not on the dielectric layer 312. In some embodiments, before the formation of the capping layer 324, a pretreatment operation may be performed to clean the surfaces of the first conductive feature 322 and the second conductive feature 326. For example, a wet clean process may be performed to remove copper oxide on top surfaces of the first conductive feature 322 and the second conductive feature 326, some post CMP residue on the dielectric layer 312, and/or organic contamination from the CMP on the dielectric layer 312, the first conductive feature 322 and the second conductive feature 326.

In some embodiments, the capping layer 324 may be formed by CVD process with Co precursor and $H_2$. In some embodiments, the first conductive feature 322 and the second conductive feature 326 may include copper (Cu). For example, during the CVD process, $H_2$ strips the dicarbonyl groups from the Co precursor resulting in cobaltocene plus $H_2$. The Cu surfaces of the first conductive feature 322 and the second conductive feature 326 then bond with the hydrogen. Then, the cobaltocene replaces the hydrogen on the surfaces of the first conductive feature 322 and the second conductive feature 326 and forms Co capping layer (the capping layer 324) on the first conductive feature 322 and the second conductive feature 326. In some embodiments, the capping layer 324 may be formed by CVD, ALD, or other suitable processes.

Figure 3G:
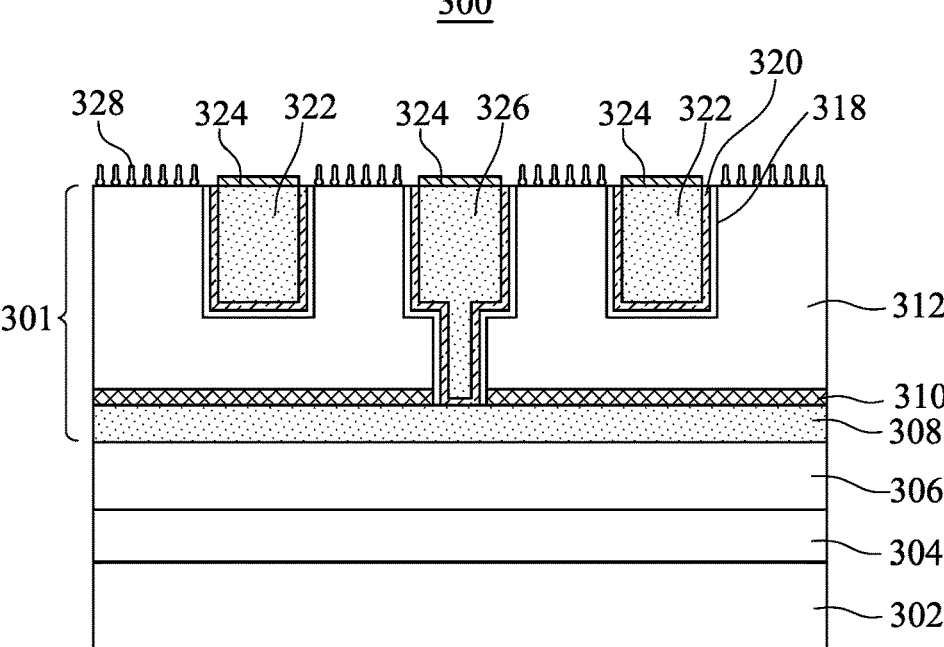

As shown in FIG. 3G and operation 514 in FIG. 5, a blocking layer 328 is formed on the dielectric layer 312. In some embodiments, the blocking layer 328 is formed by molecules with silicon-based function groups, and therefore the blocking layer 328 is formed on the dielectric layer 312, e.g., low k materials, but not on the capping layer 324, e.g., Co. For example, the blocking layer 328 may include a head group connected to a function group by way of a molecular chain. The head group is configured to adhere to preferred surfaces such as the surface of the dielectric layer 312 while not adhering to other surfaces such as the surfaces of the capping layer 324. In some embodiments, the head group may include butyltriethoxysilane, cyclohexyltrimethoxysilane, cyclopentyltrimethoxysilane, dodecyltriethoxysilane, dodecyltrimethoxysilane, decyltriethoxysilane, dimethoxy(methyl)-n-octylsilane, triethoxyethyl silane, ethyltrimethoxysilane, hexyltrimethoxysilane, hexyltriethoxysilane, hexadecyltrimethoxysilane, hexadecyltriethoxysilane, triethoxymethylsilane, trimethoxy(methyl)silane, methoxy(dimethyl)octadecylsilane, methoxy(dimethyl)-n-octyl silane, octadecyltriethoxysilane, triethoxy-n-octylsilane, octadecyltrimethoxysilane, trimethoxy(propyl)silane, trimethoxy-n-octylsilane, triethoxy(propyl)silane, methane, ethane, propane, butane, pentane, hexane, heptane, octane, nonane, decane, undecane, dodecane, pentadecane, hexadecane, any combination of the foregoing, or the like. In some embodiments, the function group may include a hydrophobic interfacial property that repels dielectric material, thereby preventing dielectric material from adhering to the blocking layer 328, in a later dielectric on metal (DoM) process. In some embodiments, the function group may include a methyl group, which provides the hydrophobic interfacial property. In some embodiments, the blocking layer 328 may be formed by a wet process, such as dip coating, spin coating, spraying coating, or other suitable processes.

Figure 3H:
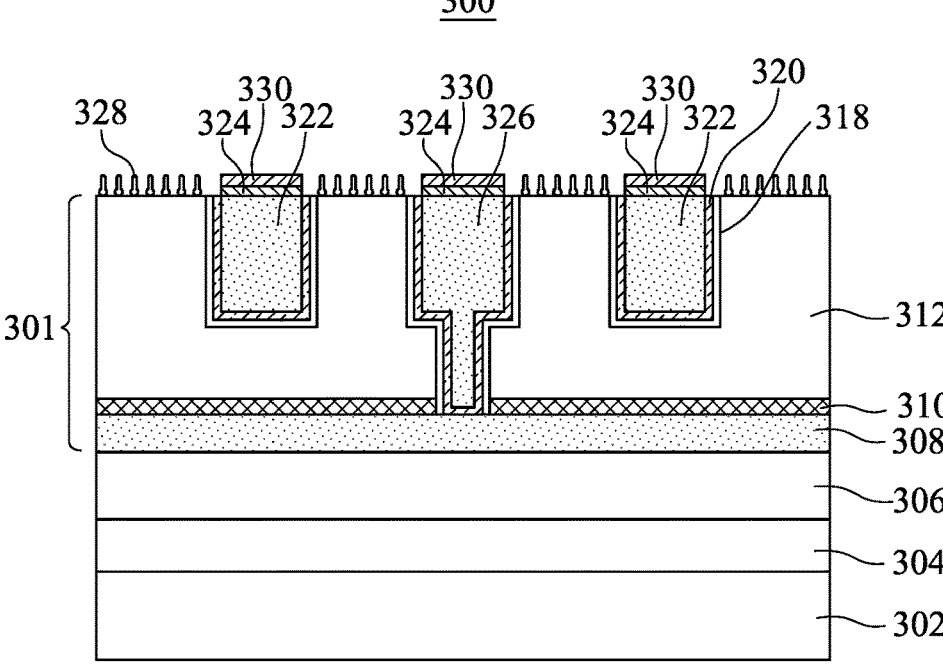

As shown in FIG. 3H and operation 516 in FIG. 5, a dielectric layer 330 is formed on the capping layer 324. In some embodiments, the dielectric layer 330 may include metal oxide, metal nitride, or other suitable materials. In some embodiments, the dielectric layer 330 may be formed by thermal ALD, or other suitable processes. In some embodiments, the dielectric layer 330 may be formed by DoM selective deposition. As described above, because of the function group of the blocking layer 328 prevents dielectric material from adhering to the blocking layer 328. The dielectric layer 330 is formed only on the capping layer 324. In some embodiments, the dielectric layer 330 may prevent damage to the below layers, such as the capping layer 324, the first conductive feature 322, and the second conductive feature 326, during subsequent processing steps.

Figure 3I:
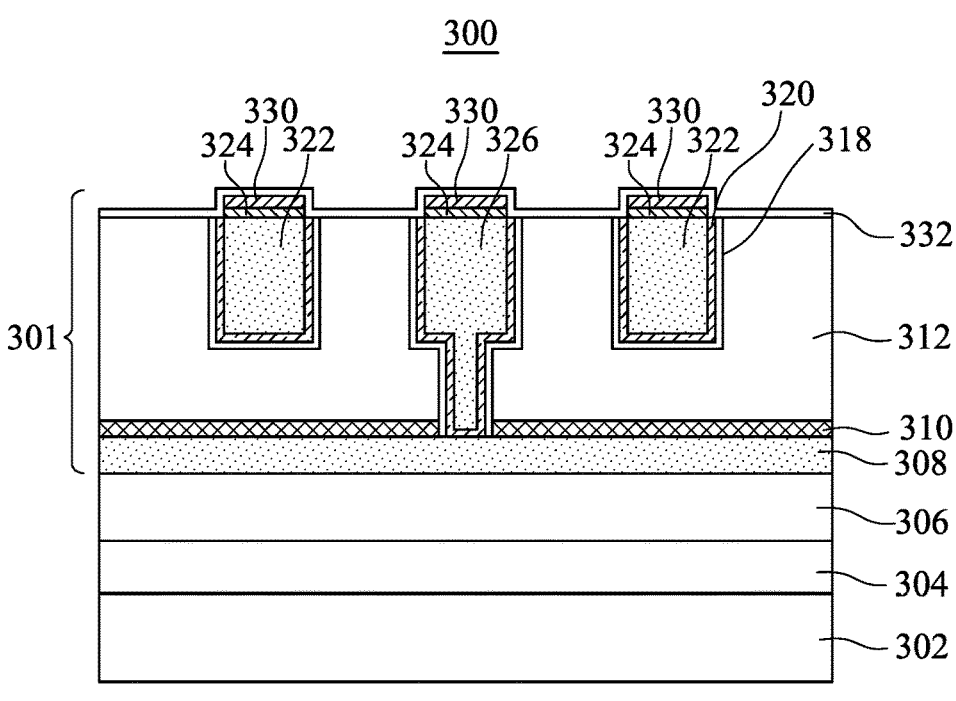
Figure 3J:
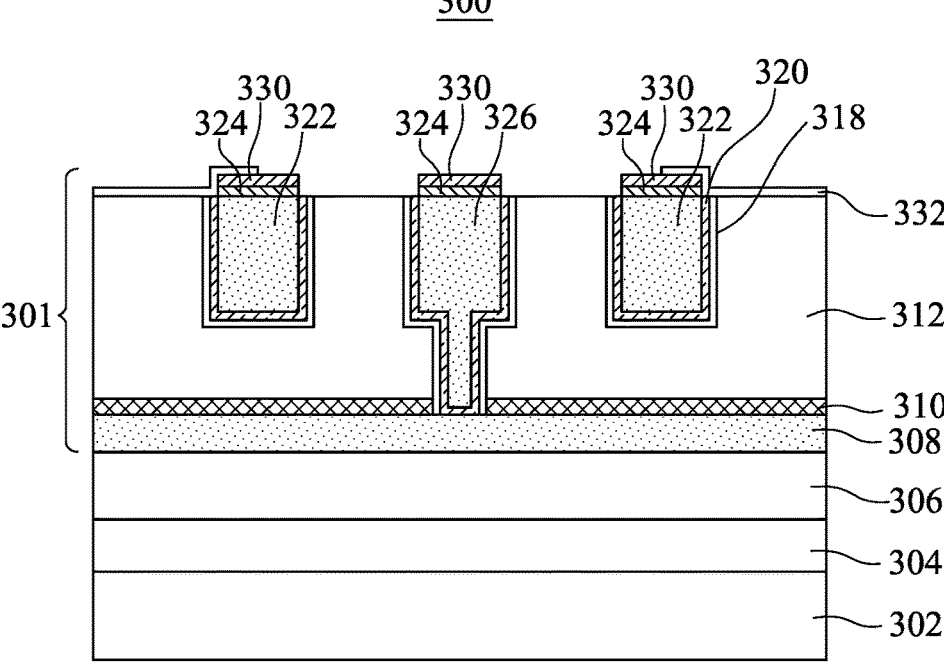

As shown in FIG. 3I, the blocking layer 328 is removed and an ESL 332 is conformally formed over the dielectric layer 312, the liner layer 318, the barrier layer 320, and the dielectric layer 330. In some embodiments, the ESL 332 may be formed by PVD, CVD, PECVD, ALD, plasma enhanced ALD (PEALD), or other suitable processes. In some embodiments, the ESL 332 may include silicon oxycarbide, silicon carbon nitride, silicon nitride, silicon carbon oxynitride, silicon dioxide, silicon carbide, silicon oxynitride, aluminum nitride, aluminum oxynitride, aluminum oxide, another dielectric material, or other suitable materials. In some embodiments, the ESL 332 may have a thickness between 5 Angstroms and 200 Angstroms. Then, as shown in FIG. 3J, a portion of the ESL 332 is removed to expose portions of the dielectric layer 312.

Figure 3K:
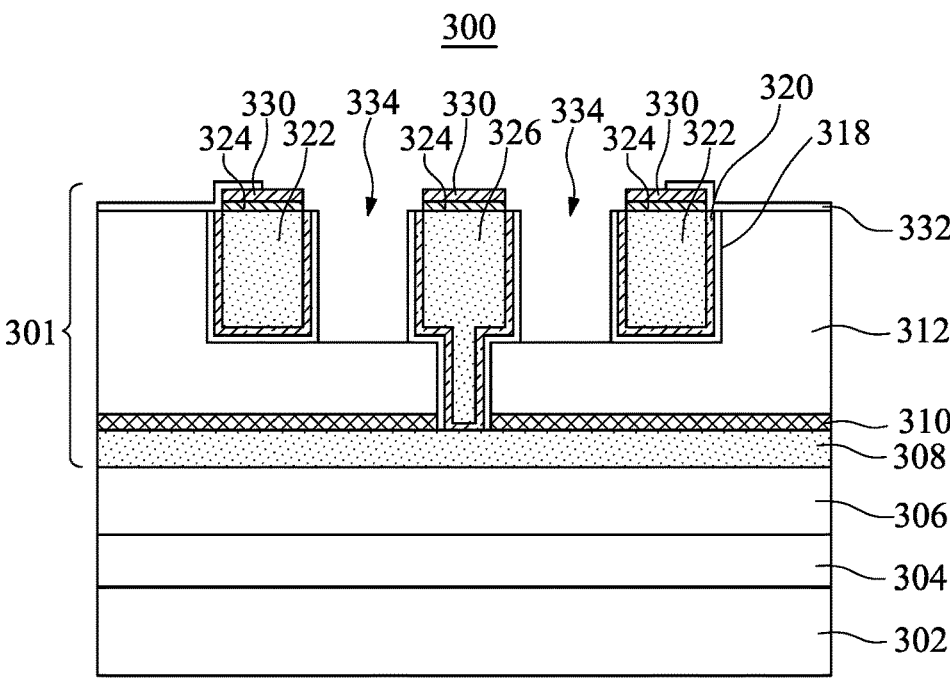

As shown in FIG. 3K, a third opening 334 is formed in the dielectric layer 312 between the first conductive feature 322 and the second conductive feature 326. In some embodiments, an etch operation is performed on the ESL 332, the dielectric layer 312, the liner layer 318, the barrier layer 320, and the dielectric layer 330. In some embodiments, the etch operation may include dry etch, wet etch, or other suitable processes. Because the sidewalls of the barrier layer 320 are covered and protected by the liner layer 318, the liner layer 318 can prevent the damage on sidewalls of the barrier layer 320 during the etch operation.

Figure 3L:
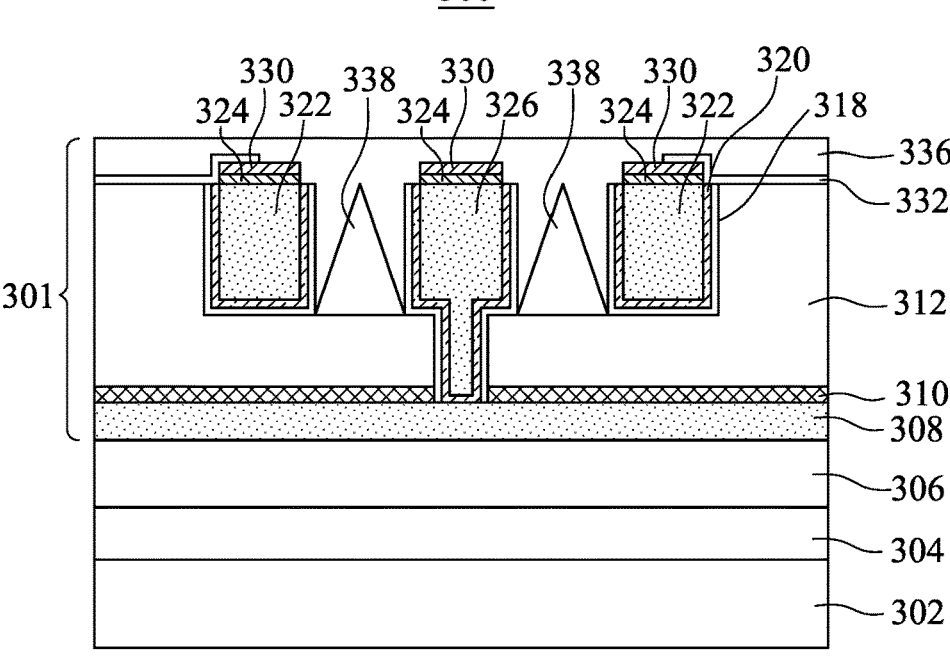

As shown in FIG. 3L, a dielectric layer 336 is formed over the third opening 334 and an air gap 338 is formed between the first conductive feature 322 and the second conductive feature 326 in the dielectric layer 336. In some embodiment, the dielectric layer 336 may partially fill the third opening 334 resulting the air gaps 338. In some embodiments, the dielectric layer 336 may be the same material as the dielectric layer 312. In some embodiments, the dielectric layer 336 may include or be made of porous SiCOH, dense SiCOH, boron nitride (BN), boron carbide (BC), or other suitable materials. In some embodiments, the dielectric layer 336 may formed by PECVD, ALD, PVD, or other suitable processes.

In some embodiments, for forming the air gap 338 in the dielectric layer 336, a non-conformal deposition process may be performed to form the dielectric layer 336 in the third opening 334 during operation 516. For example, the PECVD process may be performed to form the dielectric layer 336 in the third opening 334 and form the air gap 338 in the dielectric layer 336. In some embodiments, because of the deposition process is non-conformal, the air gap 338 may be triangle shaped or like triangle shaped, as shown in FIG. 3L. As shown in FIG. 3L, the air gap 338 is wider near a lower portion of the third opening 334 and narrower near an upper portion of the third opening 334. In some embodiments, the air gap 338 is defined by the dielectric layer 336 and the dielectric layer 312.

In some embodiments, the air gap 338 may reduce an effective dielectric constant of the dielectric layer 336. In some embodiments, the effective dielectric constant of the dielectric layer 336 may be reduced to a range between 2 and 3.6. By reducing the effective dielectric constant of the dielectric layer 336, the capacitance between the first conductive feature 322 and the second conductive feature 326 is reduced, and thereby the performance of the semiconductor structure 300 may be increased.

FIGS. 4A-4G are cross-sectional side views of various stages of manufacturing another semiconductor structure 400, including an interconnection structure 401, in accordance with some embodiments. In some embodiments, the interconnection structure 401 may be formed on or below the semiconductor device structure 100. FIG. 6 is a flow chart of a method 600 for manufacturing the interconnection structure 401 in accordance with some embodiments. For the purpose of better describing the present disclosure, the cross-sectional side view of the semiconductor structure 400 in FIGS. 4A-4G and the method 600 in FIG. 6 will be discussed together. It is understood that the operations shown in the method 600 are not exhaustive and that other operations may be performed as well before, after, or between any of the illustrated operations. Further, some of the operations may be performed simultaneously, or in a different order than shown in FIGS. 4A-4G and FIG. 6.

Figure 4A:
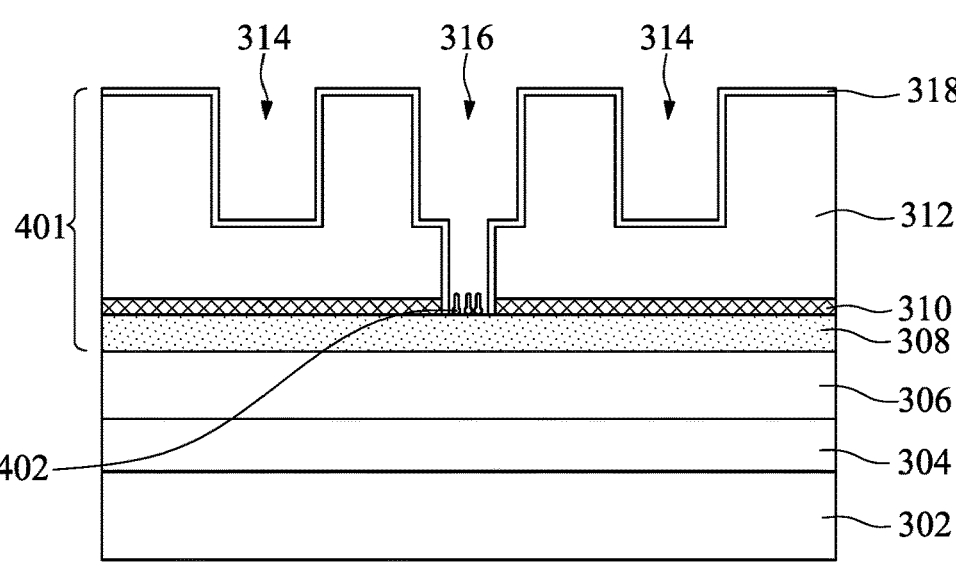
FIGS. 4A-4H are cross-sectional side views of various stages of manufacturing another semiconductor structure, in accordance with some embodiments.

As shown in FIG. 4A, the structure and manufacturing process of the semiconductor structure 400 are similar to those of the semiconductor structure 300 in FIG. 3D. In other words, the operations 602, 604, 606, and 608 in the method 600 may be similar to the operations 502, 504, 506, and 508 in the method 500. However, as shown in FIG. 4A and operation 610 in FIG. 6, after removing a portion of the liner layer 318 that covers the conductive layer 308, a blocking layer 402 is formed at the bottom of the second opening 316 on the exposed conductive layer 308.

In some embodiments, the blocking layer 402 is formed by molecules with sulfur (S) or phosphorus (P) function groups. For example, the blocking layer 402 may include a head group connected to a function group by way of a molecular chain. In some embodiments, the head group has a high affinity to the metal surface (e.g., the exposed conductive layer 308), and thus adhere and/or anchor to the exposed conductive layer 308 rather than the liner layer 318.

Figure 4B:
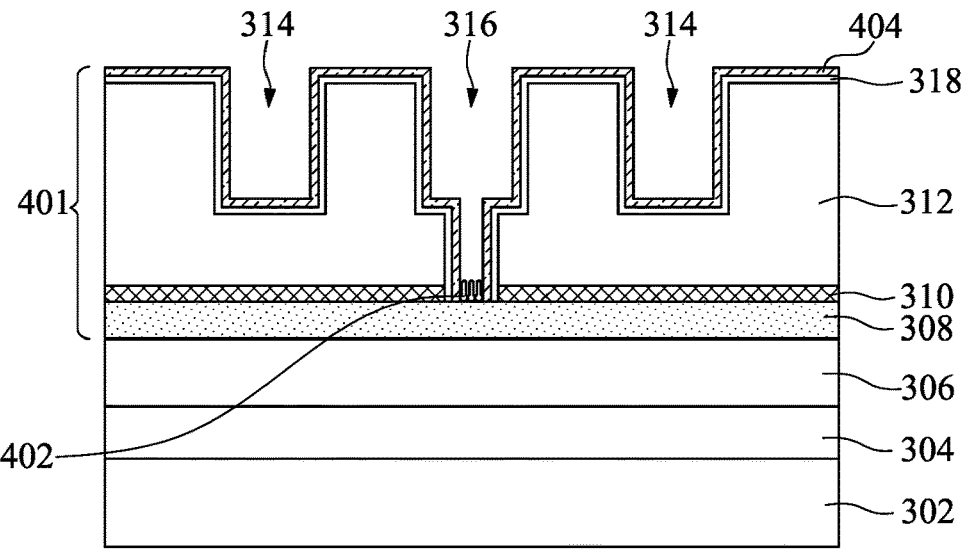

As shown in FIG. 4B and operation 612 in FIG. 6, a barrier layer 404 is formed over the liner layer 318 but not on the blocking layer 402. In some embodiments, since the blocking layer 402 is formed by molecules with S or P function groups, the S or P function group may repel the deposition of the barrier layer 404 on the blocking layer 402. In some embodiments, the barrier layer 404 may include TaN, TiN, or other suitable materials. In some embodiments, the barrier layer 404 may have a thickness between 10 Angstroms and 30 Angstroms. In some embodiments, the barrier layer 404 may be formed by thermal ALD, or other suitable processes.

Figure 4C:
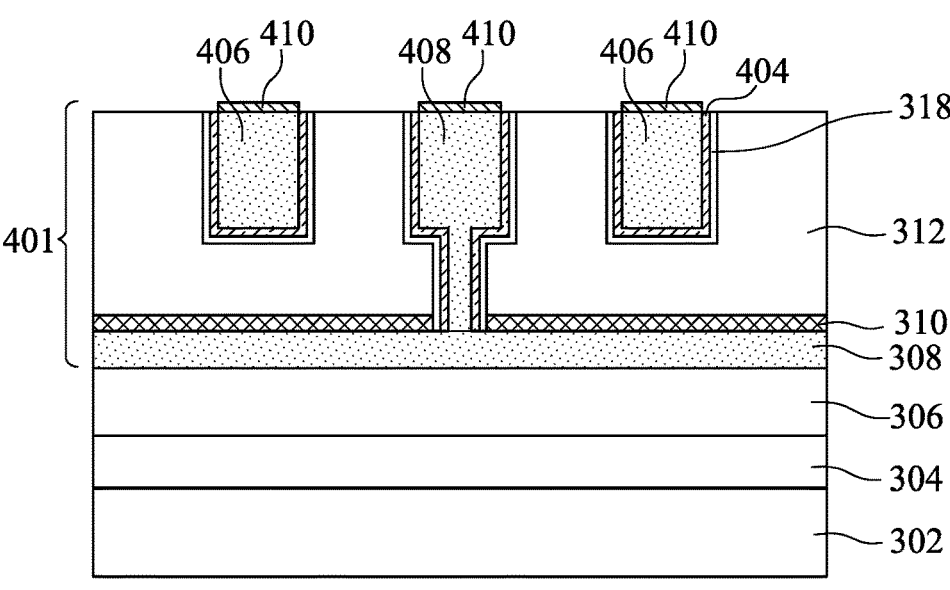

As shown in FIG. 4C and operation 614 in FIG. 6, the blocking layer 402 is removed. Then, as shown in operation 616 in FIG. 6, a first conductive feature 406, a second conductive feature 408, and a capping layer 410 are formed in the first opening 314 and the second opening 316 over the barrier layer 404. In some embodiments, the materials and the manufacturing processes of the first conductive feature 406, the second conductive feature 408, and the capping layer 410 may be similar to the materials and the manufacturing processes of the first conductive feature 322, the second conductive feature 326, and the capping layer 324. Because the blocking layer 402 prevents the formation of the barrier layer 404 at the bottom of the second opening 316, after forming the second conductive feature 408, the second conductive feature 408 can in direct contact with the conductive layer 308. Therefore, the resistance between the via structure (the second conductive feature 408) and the conductive layer 308 may be reduced.

Figure 4D:
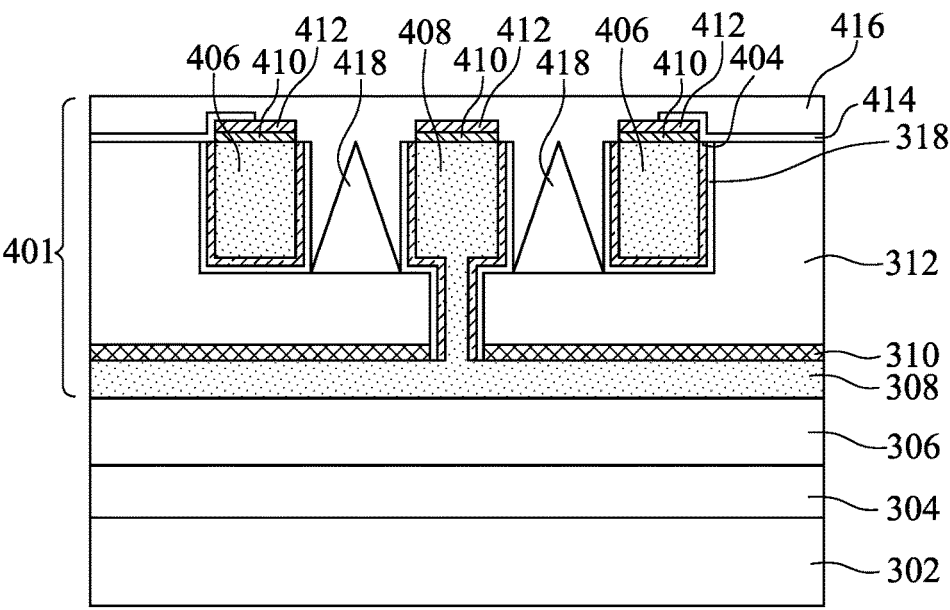

As shown in FIG. 4D, a dielectric layer 412 is formed on the capping layer 410. An ESL 414 is formed over the dielectric layer 312, the liner layer 318, the barrier layer 404, and the dielectric layer 412. A dielectric layer 416 is formed and an air gap 418 is formed between the first conductive feature 406 and the second conductive feature 408 in the dielectric layer 416. In some embodiments, the materials and the manufacturing processes of the dielectric layer 412, the ESL 414, the dielectric layer 416, and the air gap 418 may be similar to the materials and the manufacturing processes of the dielectric layer 330, the ESL 332, the dielectric layer 336, and the air gap 338 shown in FIGS. 3F-3L.

The air gap 418 may reduce an effective dielectric constant of the dielectric layer 416. In some embodiments, the effective dielectric constant of the dielectric layer 416 may be reduced to a range between 2 and 3.6. By reducing the effective dielectric constant of the dielectric layer 416, the capacitance between the first conductive feature 406 and the second conductive feature 408 is reduced, and thereby the performance of the semiconductor structure 400 may be increased.

In addition, the liner layer 318 may prevent the damage at the sidewalls of the barrier layer 404, or the first conductive feature 406 and the second conductive feature 408, during the etch process of forming the opening between the first conductive feature 406 and the second conductive feature 408. The dielectric layer 412 may prevent top side damage of the first conductive feature 406 and the second conductive feature 408 during the etch process of forming the opening between the first conductive feature 406 and the second conductive feature 408.

Furthermore, in the semiconductor structure 400, because the blocking layer 402 prevents the formation of the barrier layer 404 at the bottom of the second opening 316, the second conductive feature 408 can in direct contact with the conductive layer 308. Therefore, the resistance of the via structure may be reduced. The resistance-capacitance (RC) delay of the semiconductor structure may be further reduced.

Figure 4E:
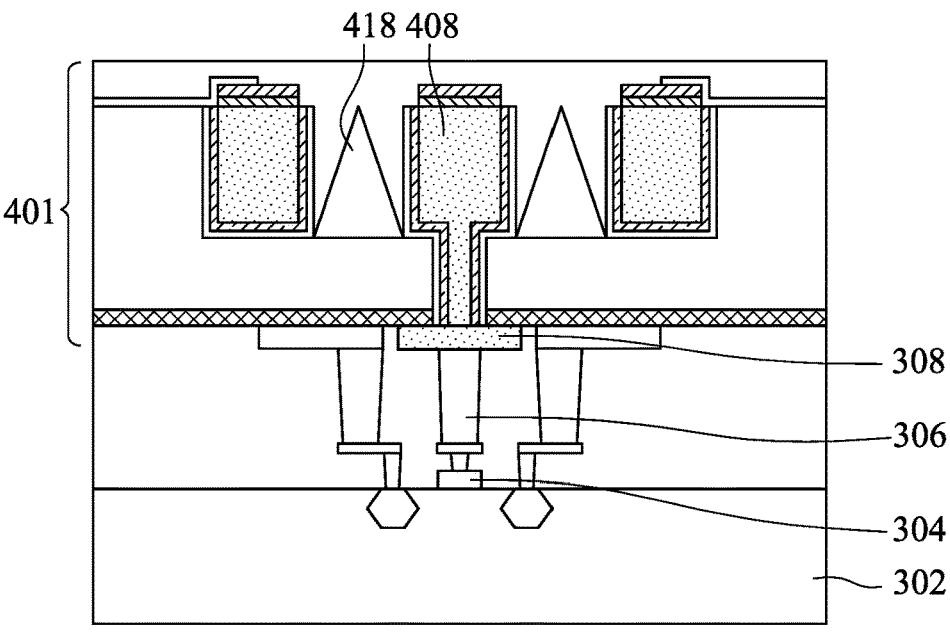

FIG. 4E illustrates an example of the semiconductor structure 400. In some embodiments, the semiconductor structure 400 may include the semiconductor substrate 302. The device 304, such as a transistor shown in FIG. 4E, may be formed on the semiconductor substrate 302. The MEOL 306 may include one or more than one conductive structure, such as one or more than one conductive layer and via, in contact with the terminals of the device 304. The interconnection structure 401 is formed on the MEOL 306.

Figure 4F:
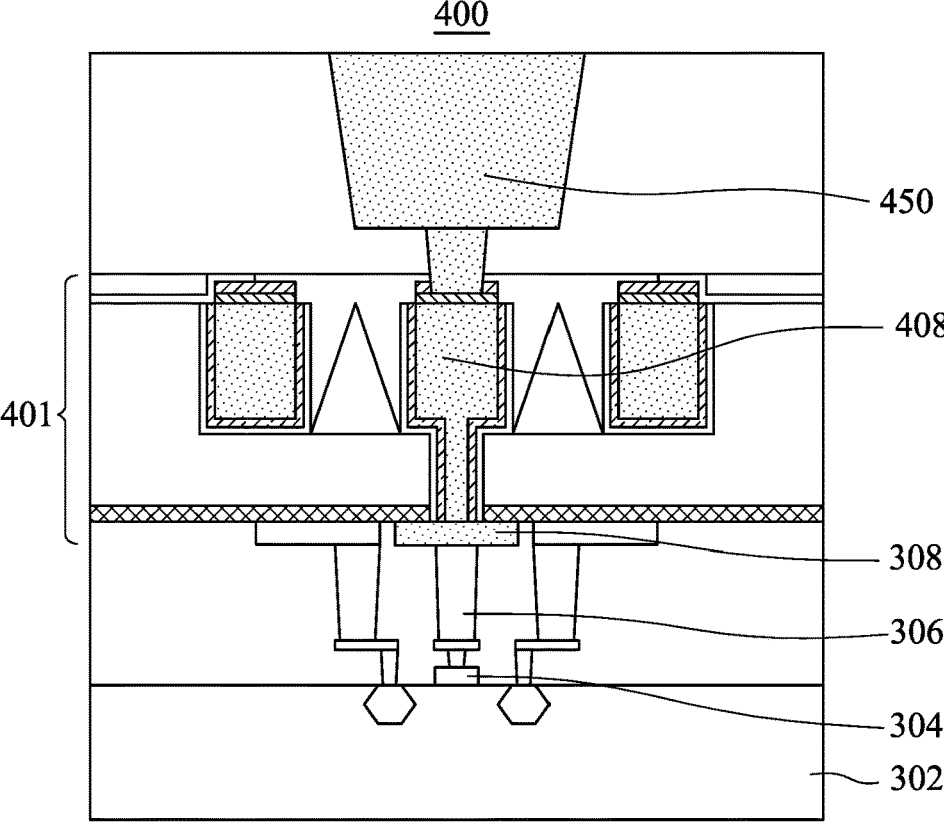
Figure 4G:
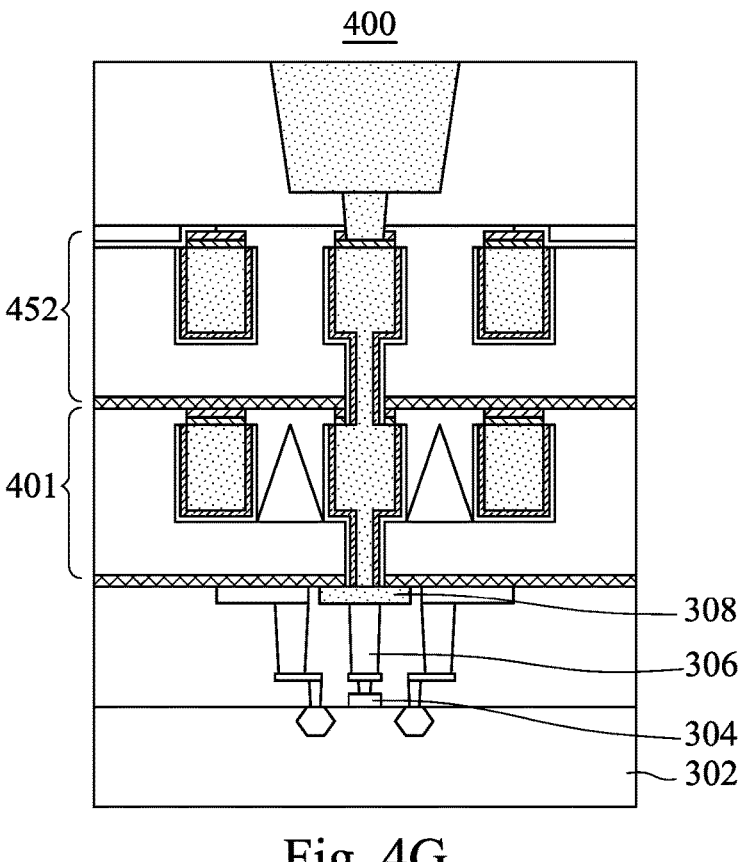

FIG. 4F illustrates another example of the semiconductor structure 400. A conductive feature 450 may be formed above the interconnection structure 401 and in electric contact with the second conductive feature 408. FIG. 4F illustrates a further example of the semiconductor structure 400. Another interconnection structure 452 may be further formed on the interconnection structure 401. Furthermore, the interconnection structure 452 may include the air gap, or without the air gap as shown in FIG. 4G.

Figure 4H:
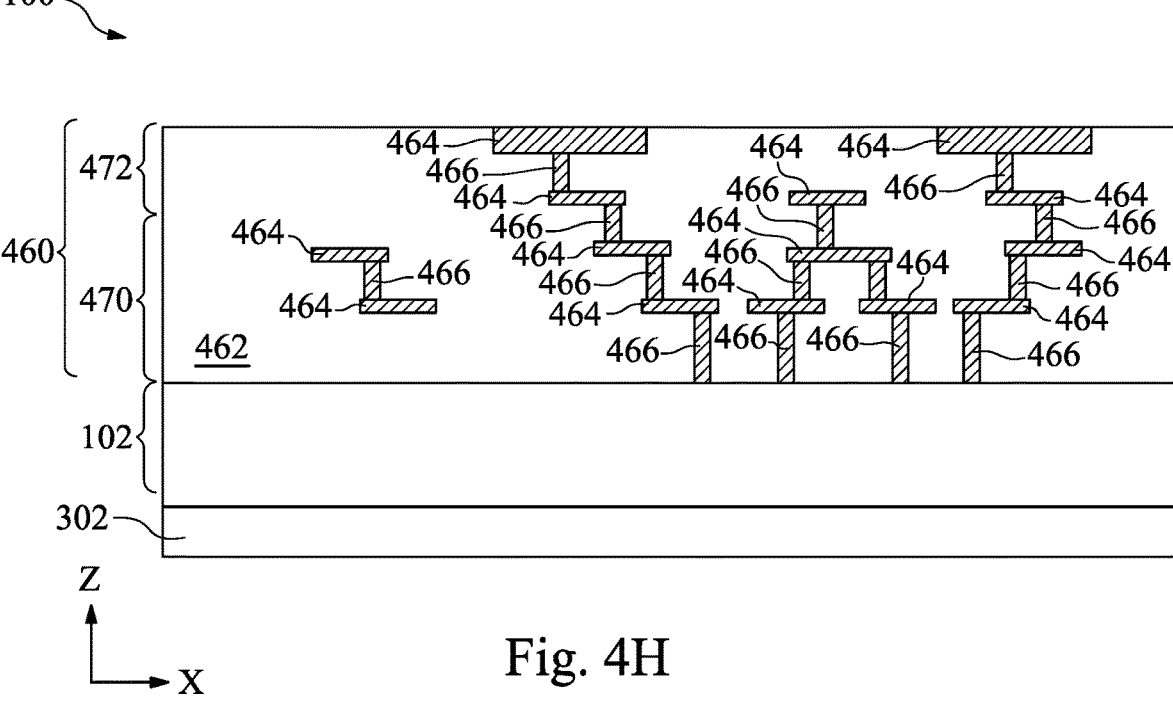

FIG. 4H is schematic cross-sectional side view of the semiconductor device structure 100 in accordance with some embodiments. The semiconductor device structure 100 may include the device layer 102 formed on and in the substrate 302 and an interconnection structure 460 formed over the device layer 102. The interconnection structure 460 includes various conductive features, such as a first plurality of conductive features 464 and second plurality of conductive features 466, and an intermetal dielectric (IMD) layer 462 to separate and isolate various conductive features 464, 466. In some embodiments, the first plurality of conductive features 464 are conductive lines and the second plurality of conductive features 466 are conductive vias. The interconnection structure 460 includes multiple levels of the conductive features 464, and the conductive features 464 are arranged in each level to provide electrical paths to various devices layer 102 disposed below. The conductive features 466 provide vertical electrical routing from the device layer 200 to the conductive features 464 and between conductive features 464. For example, the bottom-most conductive features 466 of the interconnection structure 460 may be electrically connected to the conductive contacts disposed over the S/D regions 104 (FIG. 2A) and the gate electrode layer 110 (FIG. 1B). The conductive features 464 and conductive features 466 may be made from one or more electrically conductive materials, such as metal, metal alloy, metal nitride, or silicide. For example, the conductive features 464 and the conductive features 466 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, iridium, other suitable conductive material, or a combination thereof.

The IMD layer 462 includes one or more dielectric materials to provide isolation functions to various conductive features 464, 466. The IMB layer 462 may include multiple dielectric layers embedding multiple levels of conductive features 464, 466. The IMB layer 462 is made from a dielectric material, such as SiOx, SiOxCyHz, SiOCN, SiON, or SiOxCy, where x, y and z are integers or non-integers. In some embodiments, the IMD layer 462 includes a low-k dielectric material having a k value less than that of silicon dioxide.

In some embodiments, the conductive features 464 disposed in a level of the interconnection structure 460 are partially overlapping with respect to the x-axis, which is substantially parallel to a major surface of the substrate 302, as shown in FIG. 4H. A level of the interconnection structure 460 may be a layer of the IMB layer 462. The layers are sometimes referred to as M1, M2, . . . M10, M11, et, with M1 being closest to the device layer 102. The air gap 418 described above may be included in any layers in the interconnection structure 460. Pitch of the conductive features 464, 466 increases from a lower portion 470 to an upper portion 472. In some embodiments, air gaps, such as the air gaps 418, may be located in one or more metal layers in the lower portion 470, for example M1, M2, but not presented in metal layers located in the upper portion 472, for example M10, M11. In some embodiments, the top metal layer does not include air gap. The partially overlapping conductive features 464 are described in detail below. Additional materials, such as glue layers, etch stop layers, and barrier layers, may be included in the interconnection structure 460 but are not shown in FIG. 4H for clarity.

In semiconductor devices, interconnects often account for more than half of the capacitance of a semiconductor chip and dissipate more than 50% of dynamic power of the semiconductor chip. The capacitance C of a capacitor filled with a dielectric layer having a dielectric constant k can be calculated as $kC_0$, where $C_0$ is the value of capacitance of the capacitor filled with vacuum. As discussed above, the air gap may be formed within the dielectric layer, for example, the dielectric layer 312 as shown in FIGS. 3A-3L, in which the vias 316 and trenches 314 are formed (see FIG. 3D). The air gap 338 may reduce the dielectric constant k of the dielectric layer 312 (see FIG. 3L), and the reduced dielectric constant reduces the capacitance of the interconnection structure. As the RC time constant $\tau$ is equal to the product of the resistance R and the circuit capacitance C, the reduced capacitance shortens the RC delay. Although formation of the air gap may reduce the capacitance C of the interconnection structure by reducing the dielectric constant k of the dielectric layer, during dual damascene process, the low-k dielectric layer, particularly, the upper portion of the dielectric layer in which the trenches are formed, is inevitably damaged. The dielectric constant k of the damaged dielectric layer may be higher than the original dielectric constant k of the dielectric layer before the dual damascene process. As a result, the formation of air gaps may be insufficient to reduce the RC delay to a desired value.

FIGS. 7A-7K are cross-sectional side views of various stages of manufacturing a semiconductor structure 700 including an interconnection structure according to one embodiment. In the embodiment, the issues of longer RC delay caused by increased dielectric constant k of a dielectric layer damaged by etching process are resolved. In some embodiments, the interconnection structure may be formed on and/or under the semiconductor device structure 700.

FIG. 8 is a flow chart of a method 800 for manufacturing the interconnection structure in accordance with some embodiments. For the purpose of better describing the present disclosure, the cross-sectional side view of the semiconductor structure 700 in FIGS. 7A-7K and the method 800 in FIG. 8 will be discussed together. It is understood that the operations shown in the method 800 are not exhaustive and that other operations may be performed as well before, after, or between any of the illustrated operations. Further, some of the operations may be performed simultaneously, or in a different order than shown in FIGS. 7A-7K and FIG. 8.

Figure 7A:
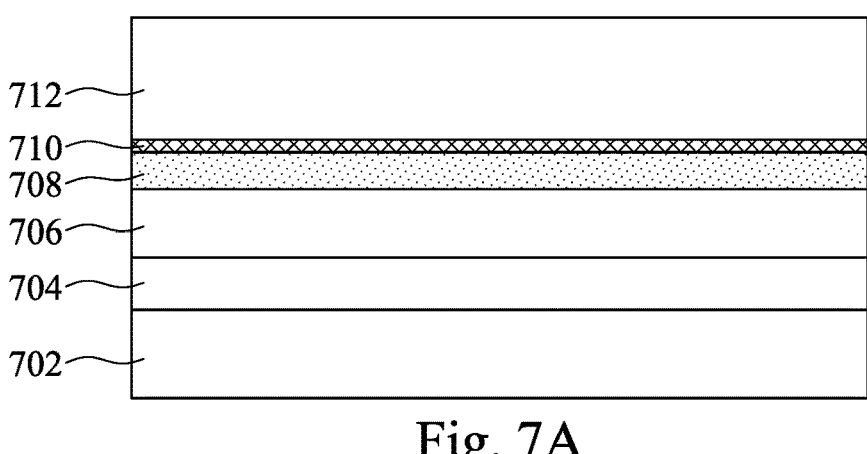
FIGS. 7A-7K are cross-sectional side views of various stages of manufacturing a semiconductor structure, in accordance with some embodiments.

As shown in FIG. 7A, a semiconductor substrate 702 including a device layer 704 and a middle end of the line (MOEL) layer 706 formed thereon is provided. The semiconductor substrate 702 may be similar to substrate 101 discussed above. The device layer 704 may include a plurality of devices formed therein. In some embodiment, the plurality of devices may include the devices 102 shown in FIGS. 2A and 2B. In the MEOL structure 706, low level interconnects (contacts) such as the conductive contacts 122 shown in FIGS. 2A and 2B are formed over the S/D regions 104 and the gate electrode layer 110. The MEOL structure 706 may have smaller critical dimensions and may be spaced closer together compared to a later formed back end of the line (BEOL) counterparts. The MEOL structure 706 may include various contacts used to electrically connect the various regions of the transistors, i.e., the source/drain features and metal gate electrode, to higher level interconnects to be formed in the BEOL.

As shown in FIG. 7A and operation 802 in FIG. 8, a conductive layer 708 is formed over the MEOL structure 706, an etch stop layer (ESL) 710 may be formed over the conductive layer 708, and a dielectric layer 712 is formed over the ESL 710. In some embodiments, the conductive layer 708 may be a conductive layer of other interconnection structures of the semiconductor structure 700. In some embodiments, the conductive layer 708 may be a conductive layer above the MEOL structure 706. In some embodiments, the conductive layer 708 may include Cu, Al, CuAl, Ru, Mo, W, and related alloys formed in a dielectric material (not shown). In some embodiments, the conductive layer 708 may be formed by ALD, CVD, PVD, electroless deposition (ELD), ECP, or other suitable processes.

In some embodiments, the ESL 710 may be used to control the etching depth in the dielectric layer 712 and serve as an etch stop when forming a later formed conductive feature in the dielectric layer 712. In some embodiments, the ESL 710 may include SiNx, SiCxNy, AlNx, AlOx, AOxNy, SiOx, SiCx, SiOxCy, or other suitable materials. In some embodiments, the ESL 710 may be formed by CVD, PVD, ALD, spin coating, or other suitable processes. In some embodiments, the dielectric layer 712 may include or be made of porous SiCOH, dense SiCOH, BN, BC, or other suitable materials. In some embodiments, the dielectric layer 712 may be formed by PECVD, ALD, PVD, or other suitable processes. The thickness of the dielectric layer 712 may range from about 100 Å to about 150 Å, for example.

Figure 7B:
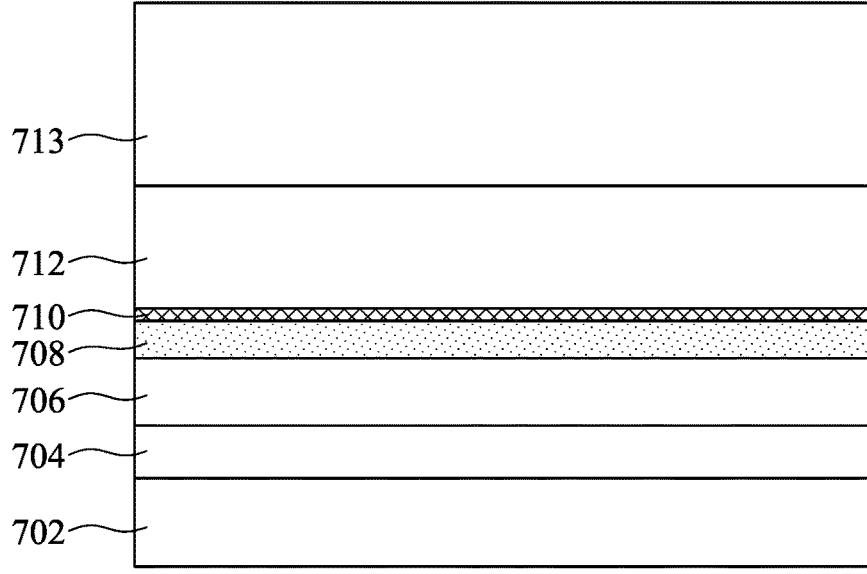

In FIG. 7B and operation 804 in FIG. 8, a sacrificial dielectric layer 713 is formed on the dielectric layer 712. The sacrificial dielectric layer 713 may be formed by low-k dielectric materials such as carbon-rich film or polymer that may be deposited by PECVD, ALD, MLD (molecular layer deposition), or other suitable processes. The thickness of the sacrificial dielectric layer 713 may range from about 300 Å to about 500 Å.

Figure 7C:
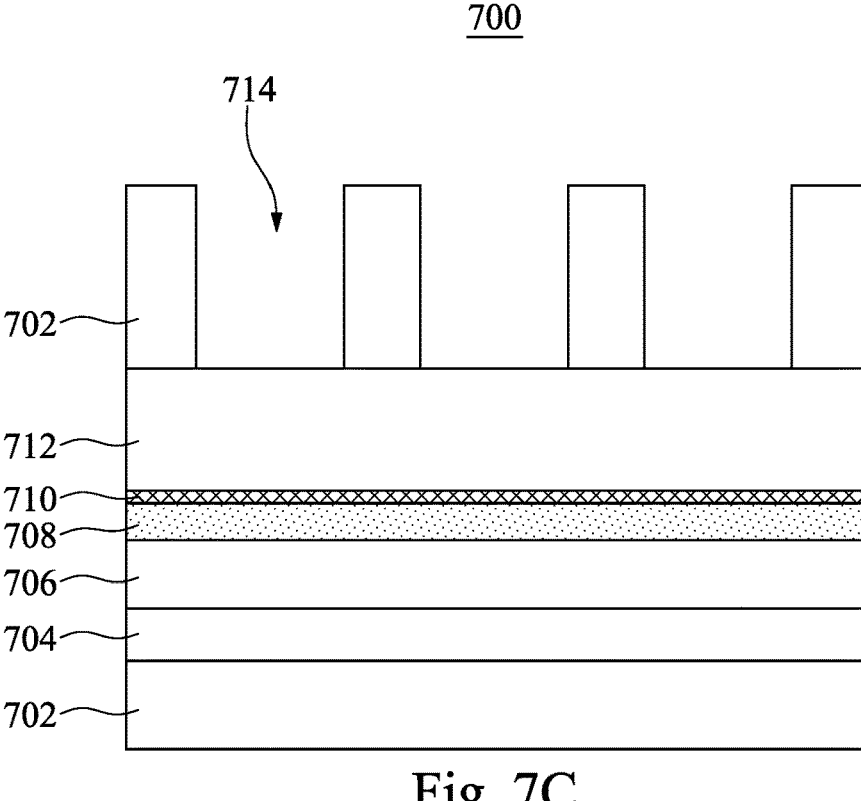

In FIG. 7C and operation 806 in FIG. 8, first openings 714 are formed to expose the dielectric layer 712. In one embodiment, the first openings 714 may be formed by plasma etching process using $C_xF_y$, $NF_x$, $C_xCl$, followed by wet clean using solution with a PH value lager than 10. In the embodiment as shown in FIG. 7C, some of the first openings 714 are designated as trenches where interconnection structures such as conductive wires that extend within the same level, for example, within the dielectric layer 712 parallel to a top or bottom surface of the semiconductor device 700.

Figure 7D:
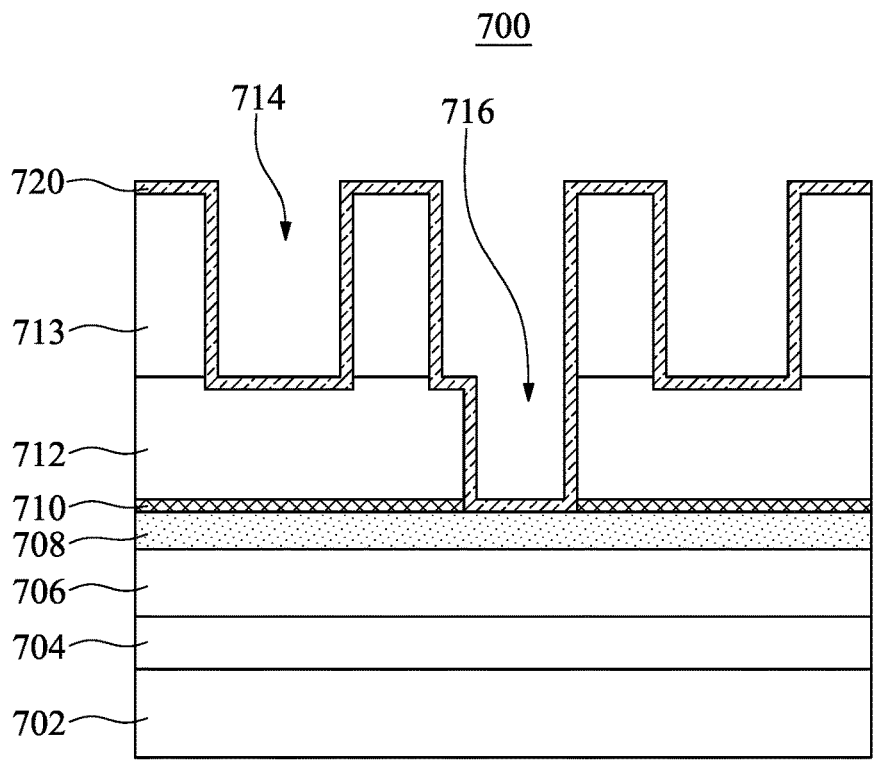

In FIG. 7D and operation 808 in FIG. 8, a second opening 716 is formed by extending at least one of the first openings 714 through the dielectric layer 712 and the underneath ESL 710 to expose the underneath conductive layer 708. The second opening 716 extending through the dielectric layer 712 may be designated as a via where contacts between metal layers or other conductive structures at different level of the semiconductor device 700 are formed. In some embodiments, the second opening 716 may be formed by dry etch, wet etch, or other suitable processes performed on the dielectric layer 712 exposed by the at least one first opening 714. Plasma etching process using $C_xF_y$, $NF_x$, $C_xCl$ followed by wet clean using solution with a PH value lager than 10 may be performed to form the second opening 716. In the embodiment as shown in FIGS. 7C and 7D, the first openings 714 are formed prior to forming the second openings 716. In some embodiments, a via may be formed to penetrate through both the sacrificial dielectric layer 713 and the dielectric layer 712, followed by etching process performed on the sacrificial dielectric layer 713 to form the first openings 714 and the second openings 716.

Figure 10A:
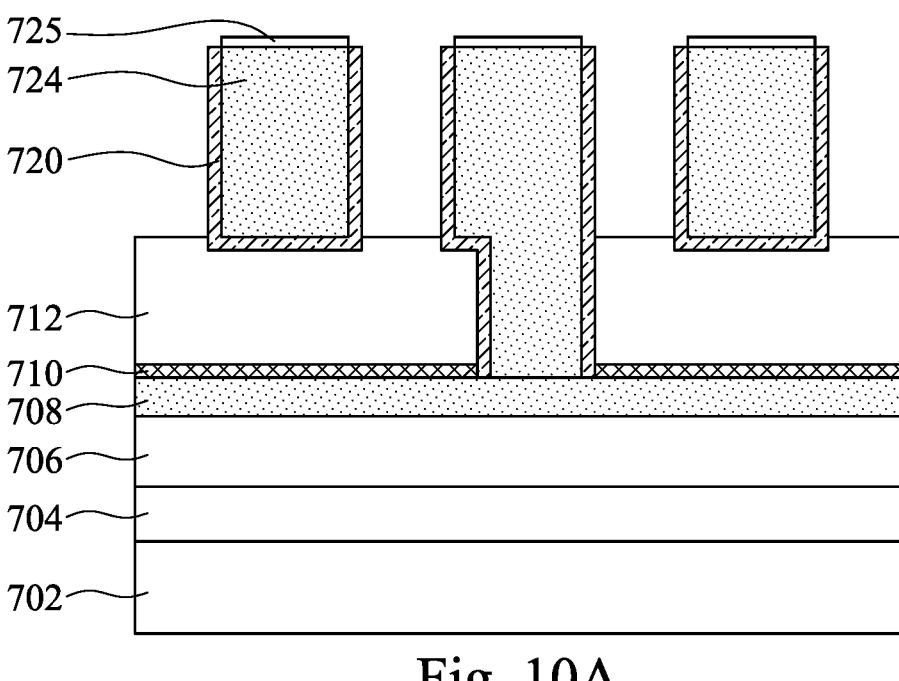
FIGS. 10A-10C are cross-sectional views of various stages of manufacturing a semiconductor structure in according to some embodiments.

In one embodiment, a liner layer (see the liner layer 721 as shown in FIG. 10A) may be conformally formed over the sacrificial dielectric layer 713. The liner layer may cover the top surface of the sacrificial dielectric layer 713, the first openings 714, and the second opening 716 including the exposed surface of the conductive layer 708. The liner layer may prevent the damage on sidewalls of the later formed barrier layer or conductive materials during a later etch process. A portion of the liner layer (if present) that covers the conductive layer 708 may be removed to expose the conductive layer 708. The removal of the portion of the liner layer may be performed by dry etch, or other suitable processes.

Then, as shown in FIG. 7D and operation 810 in FIG. 8, a barrier layer 720 is deposited over the remaining sacrificial dielectric layer 713, the remaining dielectric layer 712, and the exposed conductive layer 708. The barrier layer 720 may be conformally formed along a surface profile of the semiconductor device 700. In some embodiments, the barrier layer 720 may be formed with materials such as TaN, TiN, or other suitable materials. The barrier layer 720 may have a thickness between 10 Angstroms and 30 Angstroms or about 15 Angstroms to about 20 Angstroms. In some embodiments, the barrier layer 720 may be formed by thermal ALD or other suitable processes.

Figure 7E:
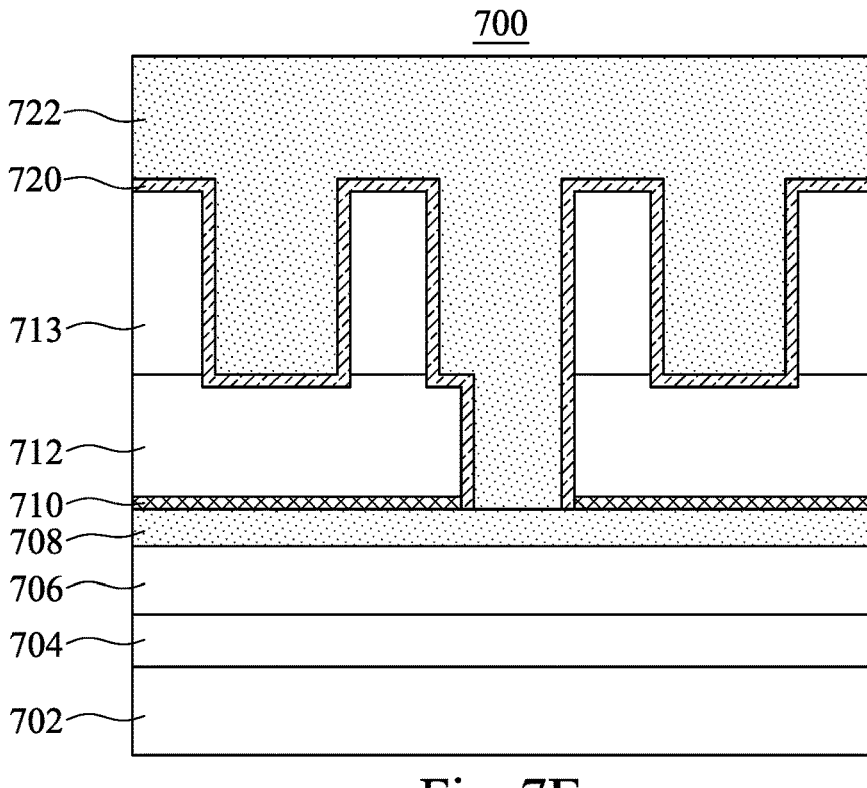
Figure 7F:
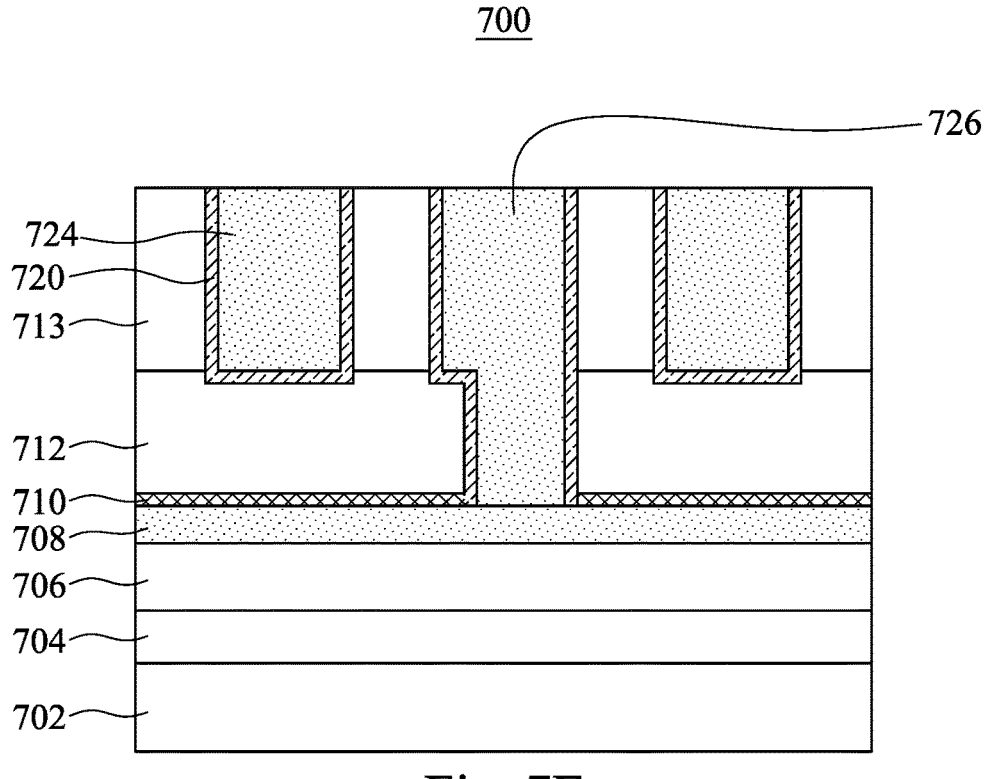
Figure 7G:
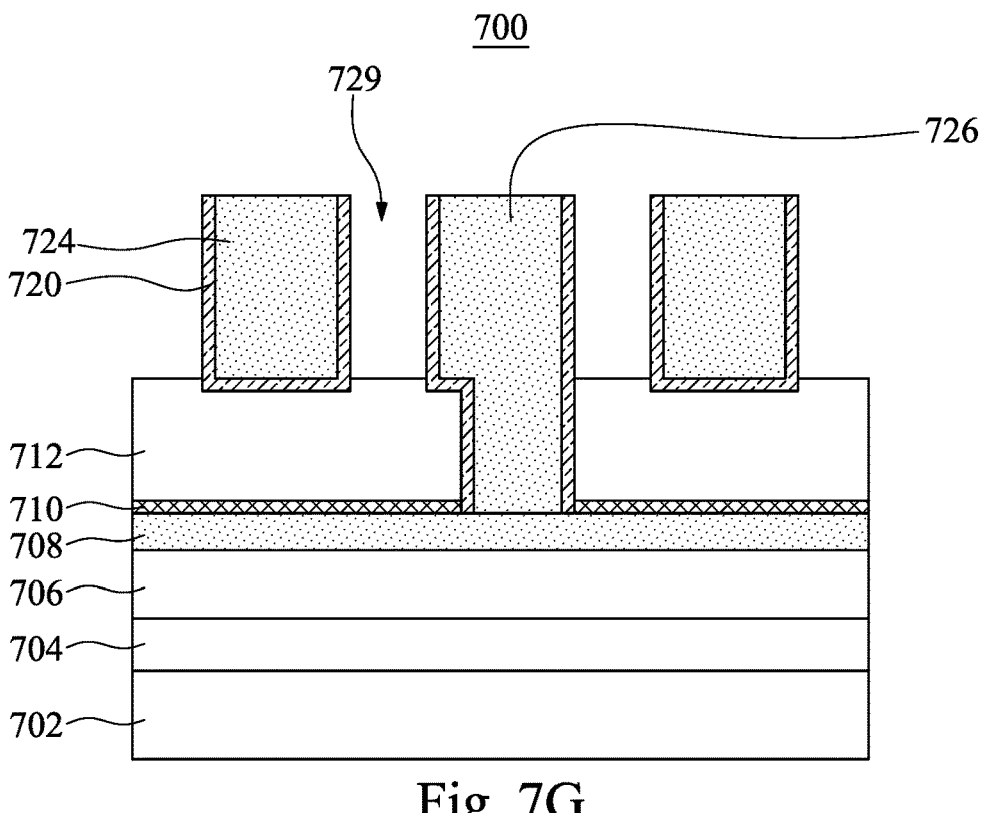

Then, as shown in FIG. 7E and operation 812 in FIG. 8, the first openings 714 and the second openings 716 are filled with conductive materials 722 to form a first conductive feature 724 and a second conductive feature 726, respectively. The conductive material may be deposited over the barrier layer 720 and overfills the first openings 714 and the second openings 716. Then, as shown in FIG. 7F and operation 813 in FIG. 8, a planarization operation, e.g., chemical mechanical polishing (CMP), may be performed so that the first conductive feature 724 and the second conductive feature 726 are formed, as shown in FIG. 7E.

In some embodiments, the first conductive feature 724 and the second conductive feature 726 may include Cu, Al, CuAl, Ru, Mo, W, and related alloys. In one embodiment, the first conductive feature 724 may include conductive wires extending at the same level, for example, within the dielectric layer 713 or a low-k dielectric layer 723 to be formed later. The second conductive feature 726 may include an interlayer contact structure that extends from one metal layer at one level to another metal layer at a different level. The first and second conductive features 724 and 726 may be deposited by ECP, ELD, PVD, or other suitable processes.

As discussed above, the sacrificial dielectric layer 713 may be damaged during the dual damascene process for forming the first and second openings 714 and 716. Therefore, after the first and second conductive features 724 and 726 are formed, as shown in the embodiment in FIG. 7G and operation 814 in FIG. 8, the sacrificial low-k dielectric layer 713 is burned out or evaporated by thermal process or removed by plasma treatment to expose the barrier layer 720 and the low-k dielectric layer 712. In some embodiment, the sacrificial low-k dielectric 713 may be removed using a heating process with a comparable temperature, for example, about 400° C. that is comparable to the BOEL process. Gaps are then formed between the neighboring first conductive feature724 and second conductive feature 726.

Figure 7H:
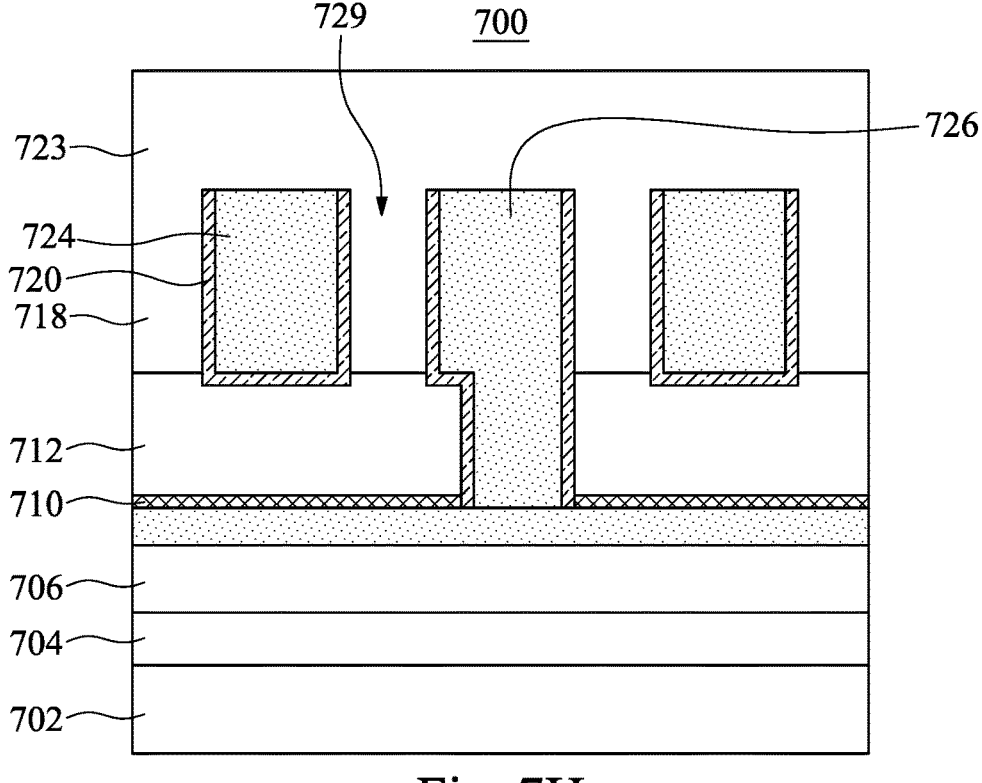

As shown in FIG. 7H and operation 816 in FIG. 8, a gap fill layer 723 is formed to fill the gaps between the first and second conductive features 724 and 726. To maintain a sufficiently low RC delay, the gap fill layer 723 is formed as a low-k dielectric layer without damage. The gap fill layer 723 may be formed to fill gaps between adjacent first conductive features 724, adjacent second conductive features 726, and/or between adjacent first conductive feature 724 and second conductive feature 726. The gap fill material 723 may be formed and overflows above the first and second conductive features 724 and 726. In one embodiment, the gap fill layer 723 may be formed by flowable low-k deposition, flowable oxide deposition, or spin-on dielectric deposition, ALD, or other suitable processes. The material of the gap fill layer 723 may be selected from materials with low dielectric constant k, for example, k≤3.6, such as porous SiCOH, dense SiCOH, BN, or BC. By using flowable low-k deposition, flowable oxide deposition, or spin-on dielectric deposition, ALD, or other suitable processes with good gap fill effect, the gap fill layer 723 may be formed to completely fill the gaps without significant air gaps formed therein.

Figure 7I:
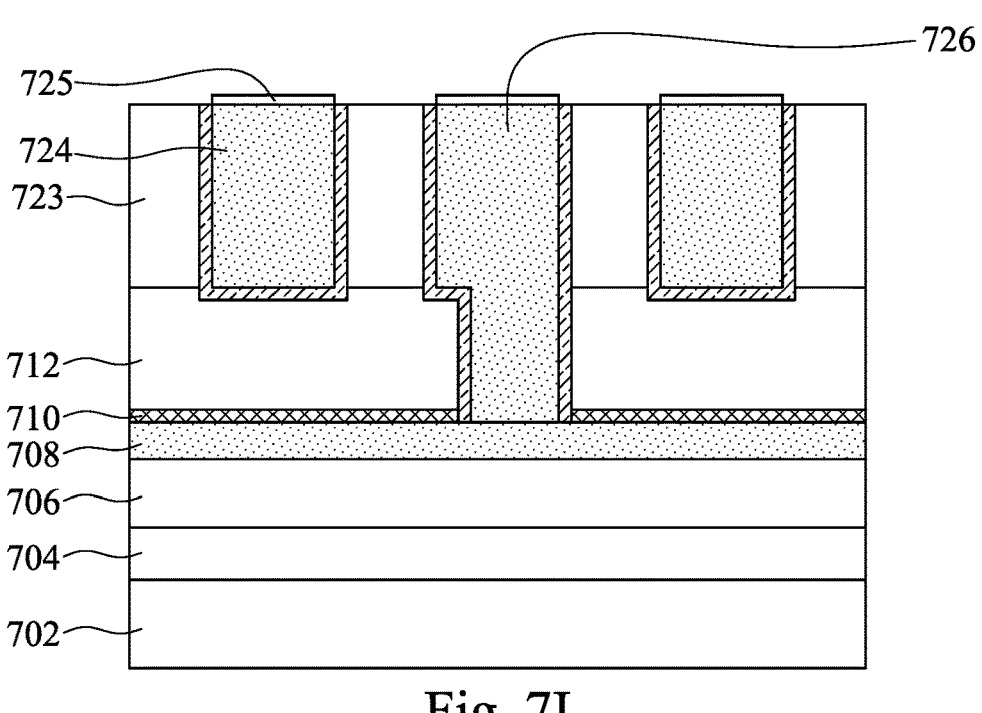

The gap fill layer 723 is then planarized to level with the top surface of the first conductive feature 224 and the second conductive feature 226. Then, as shown in FIG. 7I and operation 818 in FIG. 8, a capping layer 725 is formed on the first conductive feature 724 and the second conductive feature 726. In some embodiments, the capping layer 725 may include Cobalt (Co), or other suitable materials. In some embodiments, the capping layer 725 may be formed by CVD, ALD, or other suitable processes. In some embodiments, the capping layer 725 is selectively formed on the first conductive feature 722 and the second conductive feature 726, but not on the gap fill layer 723. In some embodiments, before the formation of the capping layer 725, a pretreatment operation may be performed to clean the surfaces of the first conductive feature 724 and the second conductive feature 726. For example, a wet clean process may be performed to remove copper oxide on top surfaces of the first conductive feature 722 and the second conductive feature 726, some post CMP residue on the gap fill layer 723, and/or organic contamination from the CMP on the gap fill layer 723, the first conductive feature 724 and the second conductive feature 726.

In some embodiments, the capping layer 725 may be formed by CVD process with Co precursor and $H_2$. The Co cap is selectively deposited on the metal, but not on dielectric material. For example, the first conductive feature 724 and the second conductive feature 726 may include copper (Cu) surfaces. During the CVD process, $H_2$ strips the dicarbonyl groups from the Co precursor resulting in cobaltocene plus $H_2$. The Cu surfaces of the first conductive feature 724 and the second conductive feature 726 is then bonded with the hydrogen. The cobaltocene may replace the hydrogen on the surfaces of the first conductive feature 722 and the second conductive feature 726 to form Co capping layer (the capping layer 725) on the first conductive feature 724 and the second conductive feature 726. In some embodiments, the capping layer 725 may be formed by CVD, ALD, or other suitable processes.

Figure 7J:
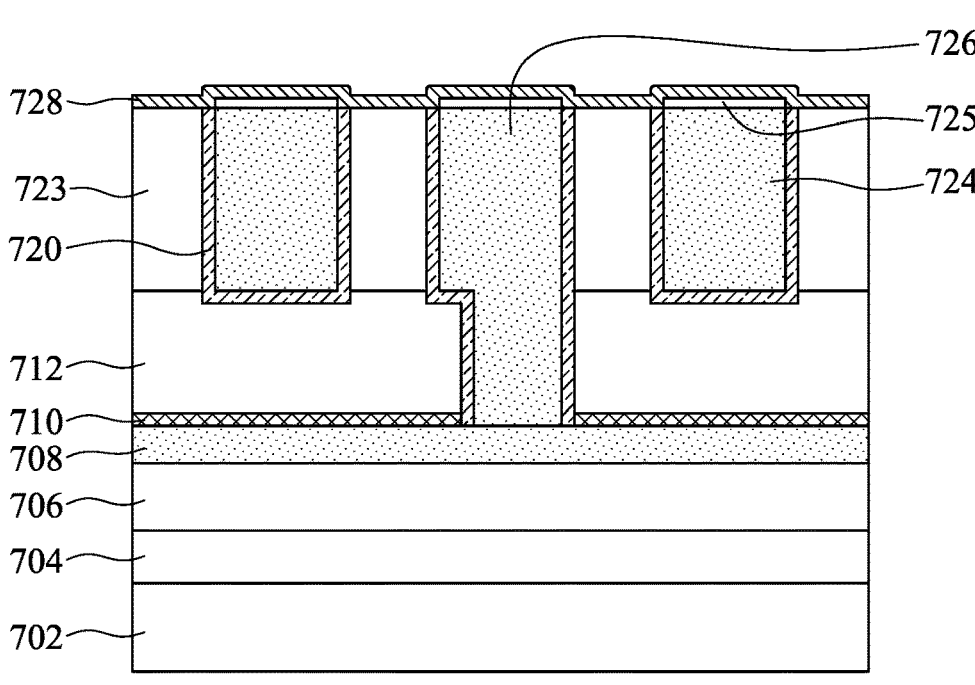

As shown in FIG. 7J and operation 820 in FIG. 8, an ESL 728 is conformally formed over the gap fill layer 723 and the capping layer 725. In some embodiments, the ESL 728 may be formed by PVD, CVD, PECVD, ALD, plasma enhanced ALD (PEALD), or other suitable processes. In some embodiments, the ESL 728 may include silicon oxycarbide, silicon carbon nitride, silicon nitride, silicon carbon oxynitride, silicon dioxide, silicon carbide, silicon oxynitride, aluminum nitride, aluminum oxynitride, aluminum oxide, another dielectric material, or other suitable materials.

Figure 7K:
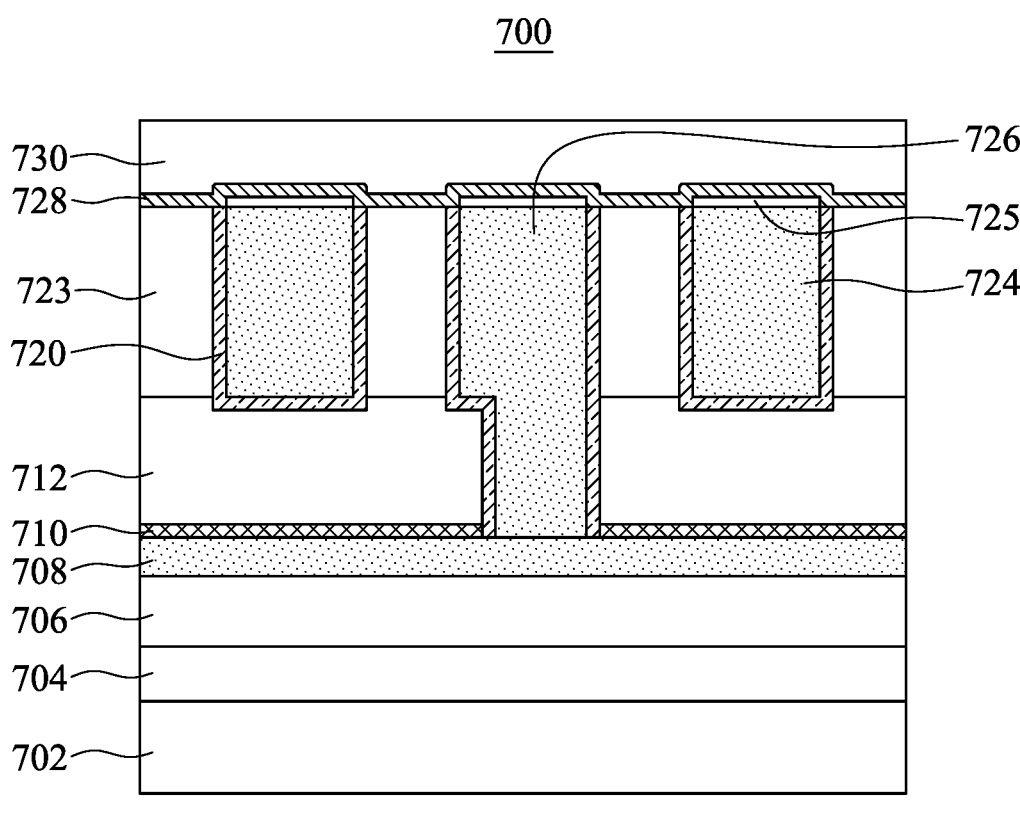

In FIG. 7K and operation 822 in FIG. 8, a low-k dielectric layer 730 is formed on the ESL layer 728. In the BOEL process, multiple metallization layers are often formed to provide appropriate interconnection between various components or structures in the semiconductor device 700 and to provide electric path to external devices. In the embodiment as shown in FIG. 7K, two metallization layers, including the $M_x$ and $M_{x+1}$ are illustrated. The $M_x$ metallization layer includes the ESL layer 710, the second conductive feature 726, the low-k dielectric layer 712 through which the second conductive feature 726 extends to connect with the conductive layer 708, the first conductive feature 724, the gap fill layer 723 through which both the first and second conductive features 724 and 726 extend, and the second conductive feature 726. The $M_{x+1}$ metallization layer includes the barrier layer 720 formed along the surfaces of the first conductive feature 724 and the second conductive feature 726, the capping layer 725, the ESL 728, the low-k dielectric layer 730, and other conductive structures which may be formed in the similar manners for forming the first and second conductive features 724 and 726. In some embodiment, similar processes for forming the $M_x$ and $M_{x+1}$ may be performed until a top metallization layer is formed. As the gap fill layer 723 is not damaged by etching or patterning process, the original low dielectric constant of the gap fill layer 723 remains unchanged. Therefore, the capacitance of the metallization of the $M_x$ metallization layer is not increased to cause high RC delay. The etch-free and damage-free low-k gap fill layer 723 further improves the reliability, such as the time-dependent dielectric breakdown (TDDB) and voltage breakdown (VBD) of the semiconductor device 700.

Figures 9A, 9B:
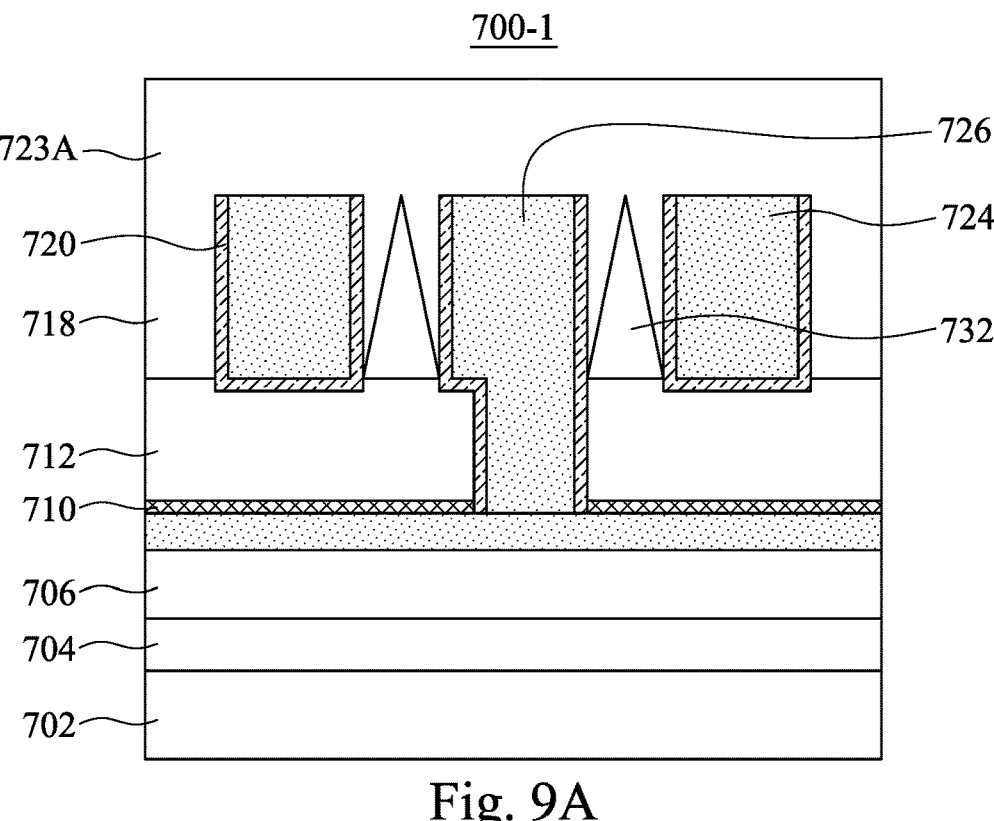
FIGS. 9A to 9D are cross-sectional side views of various stages of manufacturing a semiconductor structure, in accordance with some embodiments.
Figure 9C:
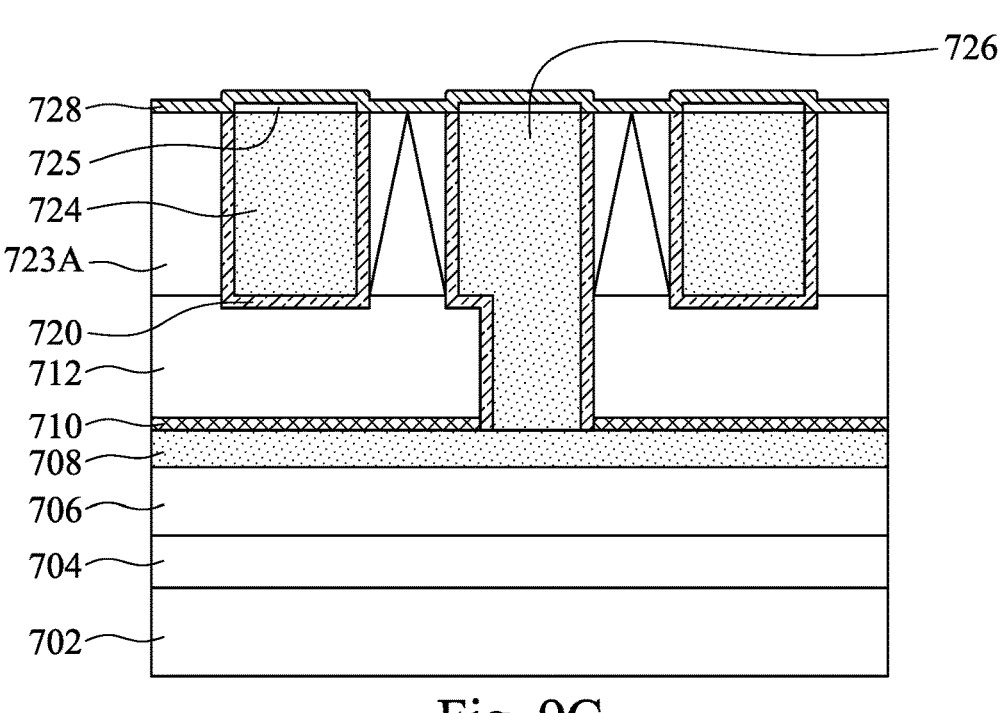
Figure 9D:
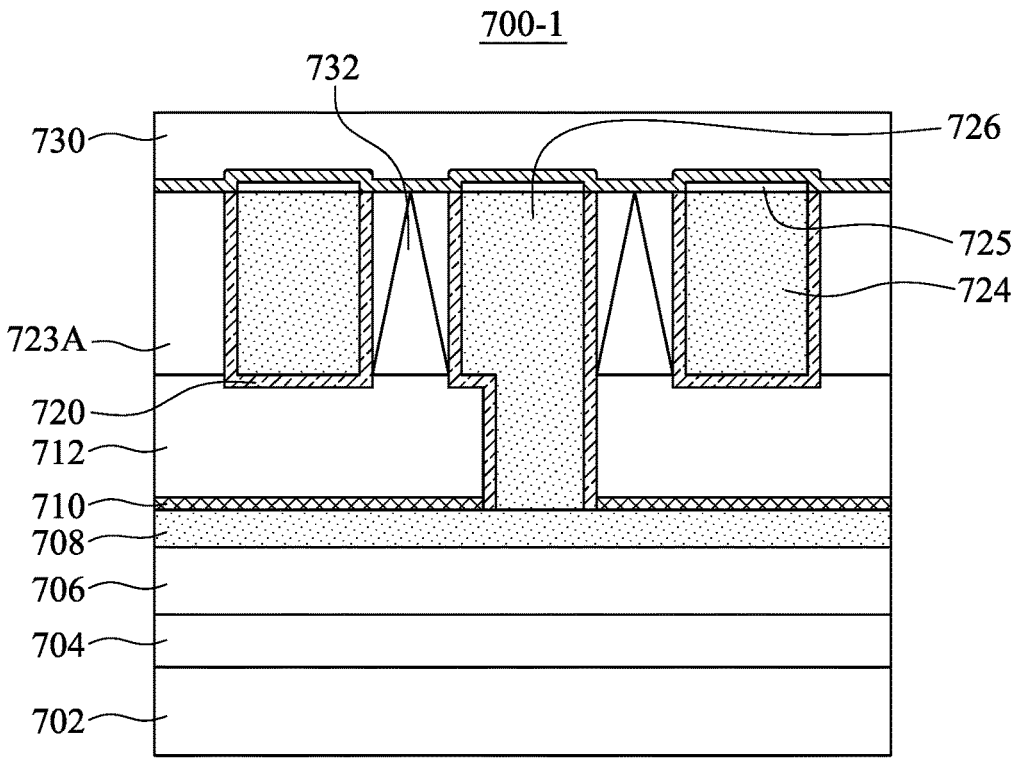

In the embodiments as shown in FIGS. 7A to 7K, the gaps between neighboring first and second conductive features 724 and 726 is filled with low-k dielectric materials using processes such as flowable low-k deposition, flowable oxide deposition, or spin-on dielectric deposition, ALD, or other suitable processes with good gap-filling effects. Therefore, the gaps are either completely filled with the low-k dielectric materials or substantially filled with insignificant sizes of voids or air gaps therein. To further reduce the dielectric constant k and consequentially reduce the RC delay, the process for forming the low-k dielectric materials may be selected from those with poor conformality (gap fill effect). The poor gap fill effect may be caused by high reaction rate of radical in plasma which often results in higher deposition rate at an upper position of an opening and lower deposition rate at a bottom position of the opening. FIGS. 9A to 9C illustrate one embodiment of a semiconductor device 700-1 of which the capacitance of interconnection structure is reduced not only by filling the gaps with damage-free low-k dielectric material, but also by formation of air gaps within the damage-free low-k dielectric material. The processes as shown in FIGS. 7A-7G may be applied to form the structure as shown in FIG. 9A. In FIG. 9A, a gap fill layer 723A, for example, a low-k dielectric layer, is deposited within the gaps and over the first conductive features 724 over the dielectric layer 712. In the embodiment as shown in FIG. 9A, deposition processes with poor gap fill effects such as PECVD or other suitable processes is performed to form the gap fill layer 723A. As a result, the gap fill layer 723A is formed with air gaps 732 between the neighboring first and second conductive features 24 and 26, particular in the gaps with small pitch as shown in FIG. 9A.

In FIG. 9A, the gap between the first conductive feature 724 and another first conductive feature (not shown) may be completely filled by the gap fill layer 723A as the pitch of the gap is larger than a predetermined value. For example, as shown in FIG. 7H-I, no air gap is formed at the side of the first conductive features 724 distant to the second conductive feature 726. The structures as shown FIGS. 9A to 9C are formed by processes substantially the same as those as shown in FIGS. 7I to 7K. Detailed descriptions are thus omitted herein.

Figure 10B:
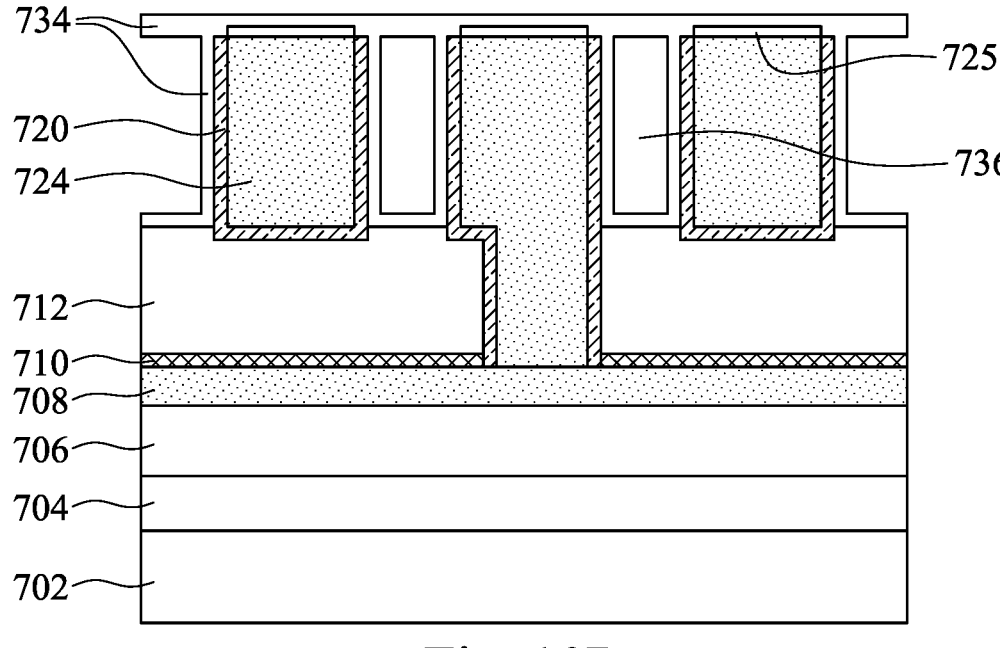
Figure 10C:
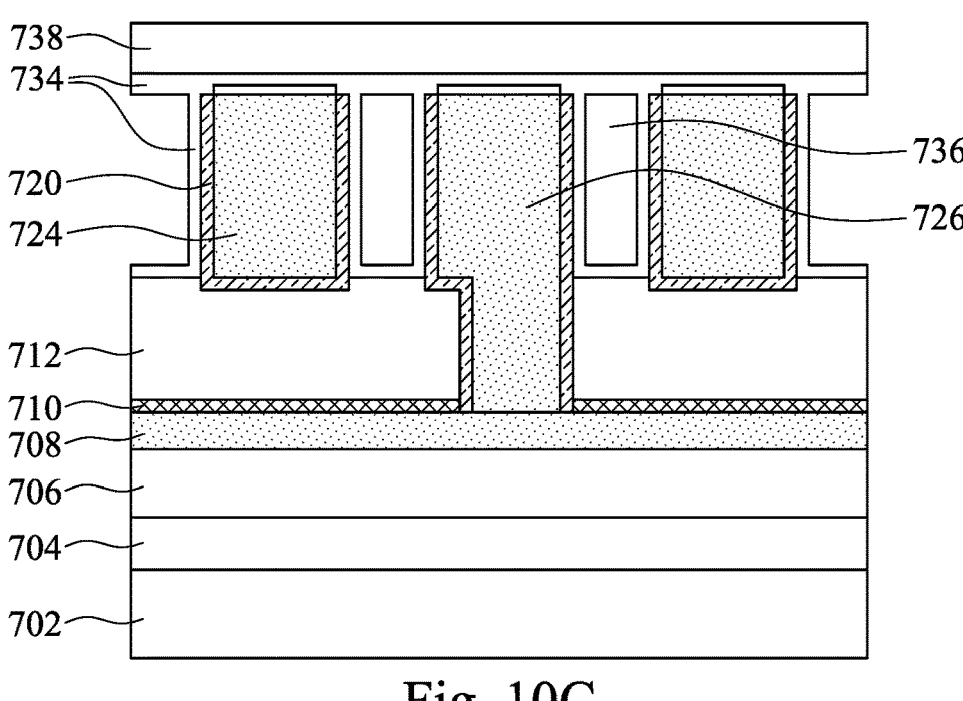

FIGS. 10A to 10C illustrate another embodiment for forming a semiconductor device 900. The semiconductor structure 900 as shown in FIG. 10A may be formed by the same processes used for forming the semiconductor structure 900 in FIG. 7G. In the embodiment as shown in FIG. 10B, a conformal barrier layer 702 is formed along the surface of the semiconductor structure 900, followed by formation of an etch stop layer (ESL) 734. The ESL 734 may be formed with a predetermined thickness to avoid punch when a via is formed in the next metallization layer. In some embodiment, PECVD is used due to its poor conformality (poor gap fill effect) caused by high reaction rate of radical in plasma which often results in higher deposition rate at an upper position of an opening and lower deposition rate at a bottom position of the opening.

As shown in FIG. 10B, no additional gap filling process is performed before forming the ESL 734. That is, empty spaces or air gaps 736 are formed between the neighboring first and second conductive features 724 and 726. In some embodiment, the ESL 734 may be a bi-layer or a tri-layer structure with two or three layers formed over the first and second conductive layers 724 and 726. For the bi-layer and the tri-layer structures, the first deposited layer is formed by process with poor conformality, such that air gaps 736 may be enclosed between the neighboring first and second conductive features 724 and 726 to obtain the desired device reliability such as short RC delay, and improved VBD and TDDB. In FIG. 9C, a low-k dielectric layer 738 is formed on the ESL 734.

Figure 11A:
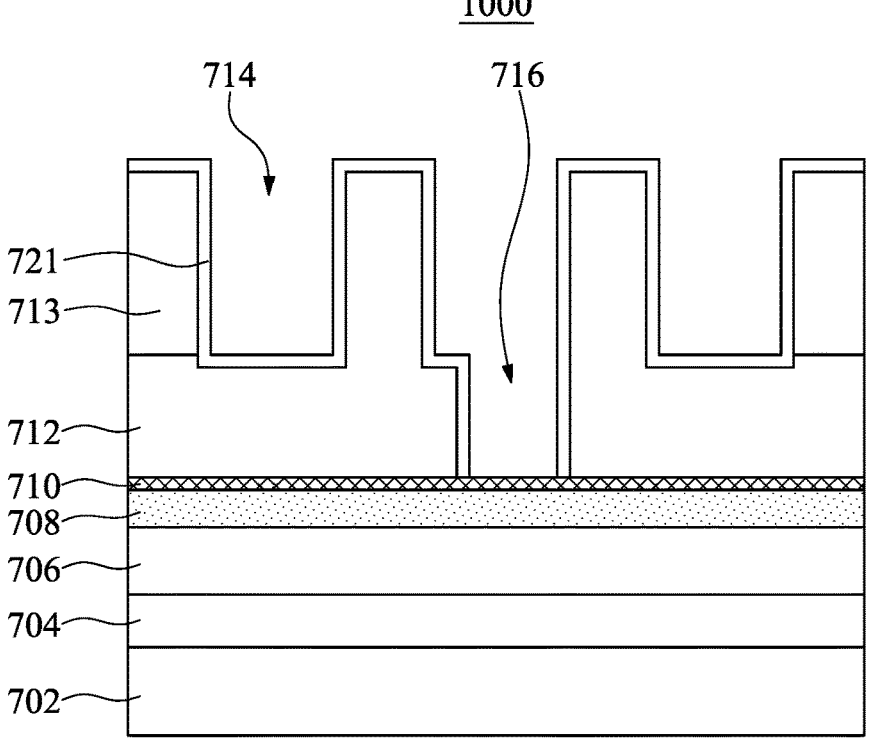
FIGS. 11A to 11E are cross-sectional views of various stages of manufacturing a semiconductor structure in according to some embodiments.

FIGS. 11A to 11E are cross-sectional side views of various stages of manufacturing another semiconductor structure 900 including an interconnection structure in accordance with some embodiments. In some embodiments, the interconnection structure may be formed on or below the semiconductor device structure 100. It is understood that the operations as shown in FIGS. 11A to 10E are not exhaustive and that other operations may be performed as well before, after, or between any of the illustrated operations. Further, some of the operations may be performed simultaneously, or in a different order than shown in FIGS. 11A-11E.

As shown in FIG. 11A, a liner layer 721 is formed on a semiconductor device 900. Processes as shown in FIGS. 7A to 7C for forming the semiconductor device 700 may be used for forming the semiconductor structure 900 as shown in FIG. 11A. In the embodiment as shown in FIG. 10A, the liner layer 721 may be conformally formed along the top surface of the sacrificial dielectric layer 713, the surfaces of first openings 714 and the second opening 716, and the exposed surface of the conductive layer 708 within the second opening 716. The liner layer 721 may prevent the damage on sidewalls of the subsequently formed barrier layer 720 (see FIG. 10B) or conductive materials during a later etch process. The liner layer 721 may include metal oxide, metal nitride, silicon oxide doped carbide (ODS), or other suitable materials. In some embodiments, the liner layer 721 may include AlOx, ZrOx, YOx, AlNx, TiNx, SiNx, SiCxNy, ODS, or other suitable materials. In some embodiments, the liner layer 721 may be formed by PECVD, ALD, PVD, or other suitable processes. The liner layer 721 may prevent the damage on sidewalls of the later formed barrier layer or conductive materials during a later etch process.

Figure 11B:
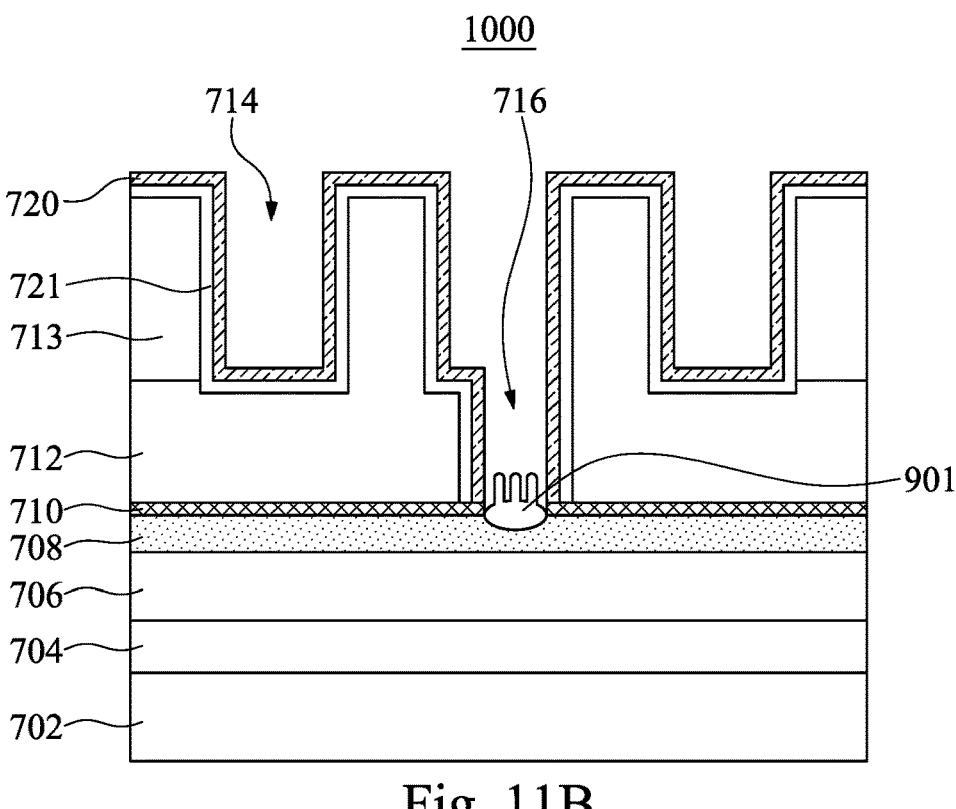

In FIG. 11B, the portion of the liner layer 721 covering the conductive layer 708 and the underneath ESL 710 may be removed to expose the conductive layer 708. The removal of the portion of the liner layer 721 may be performed by dry etch or other suitable processes. After removing the portion of the liner layer 721 that covers the conductive layer 708 and the underneath ESL 710, a blocking layer 901 is formed at the bottom of the second opening 716 on the exposed conductive layer 708. In some embodiments, the blocking layer 901 is formed by molecules with sulfur (S) or phosphorus (P) function groups. For example, the blocking layer 702 may include a head group connected to a function group by way of a molecular chain. In some embodiments, the head group has a high affinity to the metal surface (e.g., the exposed conductive layer 308), and thus adhere and/or anchor to the exposed conductive layer 708 rather than the liner layer 721.

Further referring to FIG. 11B, a barrier layer 720 is formed over the liner layer 721 but not on the blocking layer 901. In some embodiments, since the blocking layer 901 is formed by molecules with S or P function groups, the S or P function group may repel the deposition of the barrier layer 720 on the blocking layer 901. In some embodiments, the barrier layer 720 may include TaN, TiN, or other suitable materials. In some embodiments, the barrier layer 720 may have a thickness between 10 Angstroms and 30 Angstroms. In some embodiments, the barrier layer 720 may be formed by thermal ALD, or other suitable processes.

Figure 11C:
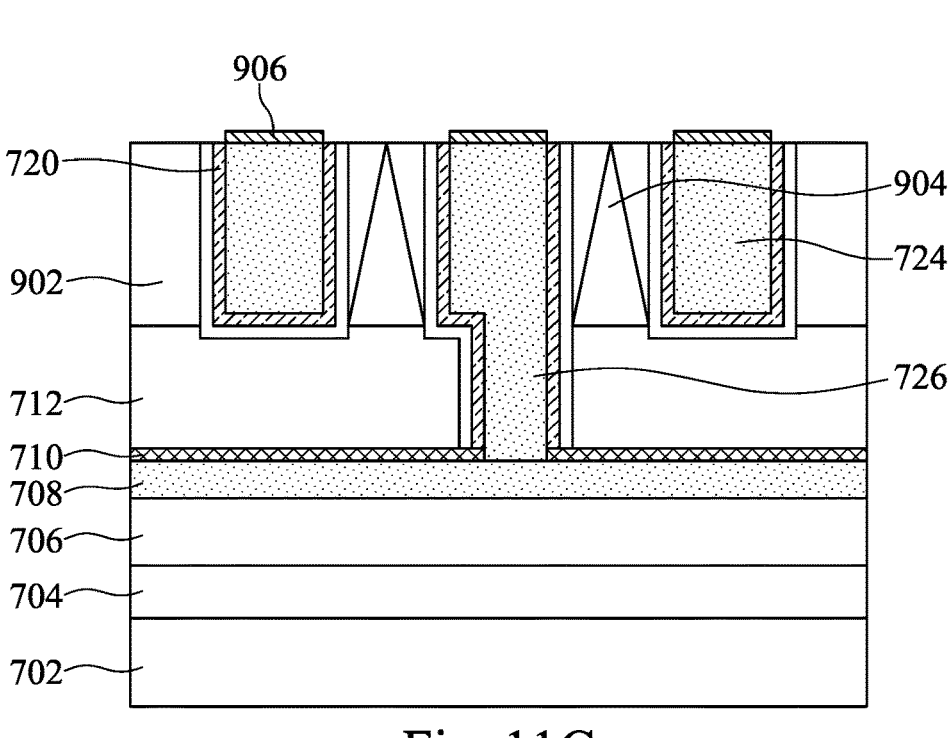

As shown in FIG. 11C, the blocking layer 901 is removed. A first conductive feature 724 and a second conductive feature 726 are formed in the first opening 714 and the second opening 716 over the barrier layer 720. In some embodiments, the materials and the manufacturing processes for forming the first conductive feature 724, the second conductive feature 726 may be similar to the materials and the manufacturing processes of the first conductive feature 322 and the second conductive feature 326 as shown in FIGS. 7E-7K. Because the blocking layer 901 prevents the formation of the barrier layer 720 at the bottom of the second opening 716, the subsequently formed second conductive feature 726 can be in direct contact with the conductive layer 708. Therefore, the resistance between the via structure (the second conductive feature 726) and the conductive layer 708 may be reduced. The RC delay may thus be reduced.

In some embodiments, the first conductive feature 724 and the second conductive feature 726 may include Cu, Al, CuAl, Ru, Mo, W, and related alloys. In some embodiments, the first conductive feature 724 and the second conductive feature 726 may include the conductive wires formed on the same level and the interlayer contact structure, respectively, deposited by ECP, ELD, PVD, or other suitable processes.

In FIG. 11C, the sacrificial dielectric layer 713 may have been damaged during the dual damascene process for forming the second opening 716. Therefore, the sacrificial low-k dielectric layer 713 is burned out or evaporated by thermal process or removed by plasma treatment to expose the barrier layer 720 and the low-k dielectric layer 712. In one embodiment, the sacrificial low-k dielectric 713 may be removed using a heating process with a comparable temperature, for example, about 400° C. that is comparable to the BOEL process.

Figure 11D:
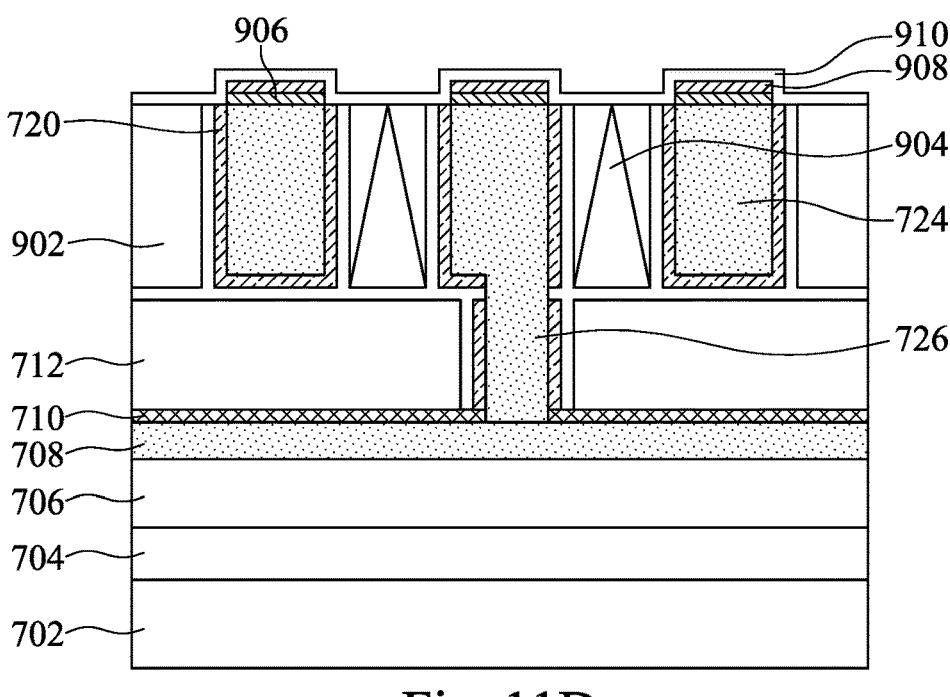

A low-k gap fill layer 902 is formed to fill the gaps between the first and second conductive features 724 and 726 as shown in FIG. 10D. The low-k gap fill layer 902 may be formed to overflow above the first and second conductive features 724 and 726. In the embodiment as shown in FIG. 11D, by using deposition with poor gap filling effect, air gaps 904 are formed in the gap fill layer 902 between the gaps with smaller pitches. For example, the gaps between the second conductive feature 726 and the two immediately neighboring first conductive features 724 that have a pitch smaller than a predetermined value may be incompletely or partially filled with the low-k gap fill layer 902. In other embodiment, the gap fill layer 904 may be formed by flowable low-k deposition, flowable oxide deposition, or spin-on dielectric deposition, ALD, or other suitable processes. The material of the gap fill layer 902 may be selected from porous SiCOH, dense SiCOH, BN, or BC, for example. By using flowable low-k deposition, flowable oxide deposition, or spin-on dielectric deposition, ALD, or other suitable processes with good gap fill effect, the gap fill layer 902 may be formed without significant air gaps formed therein similar to the embodiment as shown in FIGS. 7A to 7K. In yet another embodiment, the deposition of the gap fill layer 902 is skipped, leaving the gaps unfilled similar to the embodiment as shown in FIGS. 10A to 10C.

The gap fill layer 902 is then planarized to level with the top surface of the first conductive feature 724 and the second conductive feature 726. A capping layer 906 is formed on the first conductive feature 724 and the second conductive feature 726. In some embodiments, the capping layer 906 may include Cobalt (Co), or other suitable materials. In some embodiments, the capping layer 906 may be formed by CVD, ALD, or other suitable processes.

In some embodiments, the capping layer 906 is selectively formed on the first conductive feature 724 and the second conductive feature 726 but not on the gap fill layer 902. In some embodiments, before the formation of the capping layer 906, a pretreatment operation may be performed to clean the surfaces of the first conductive feature 724 and the second conductive feature 726. For example, a wet clean process may be performed to remove copper oxide on top surfaces of the first conductive feature 724 and the second conductive feature 726, some post CMP residue on the gap fill layer 902, and/or organic contamination from the CMP on the gap fill layer 902, the first conductive feature 724 and the second conductive feature 726.

In some embodiments, the capping layer 906 may be formed by CVD process with Co precursor and $H_2$. The Co cap is selectively deposited on the metal, but not on dielectric material. For example, the first conductive feature 724 and the second conductive feature 726 may include copper (Cu) surfaces. For example, during the CVD process, $H_2$ strips the dicarbonyl groups from the Co precursor resulting in cobaltocene plus $H_2$. The Cu surfaces of the first conductive feature 724 and the second conductive feature 726 then bond with the hydrogen. Then, the cobaltocene replaces the hydrogen on the surfaces of the first conductive feature 724 and the second conductive feature 726 and forms Co capping layer (the capping layer 906) on the first conductive feature 724 and the second conductive feature 726. In some embodiments, the capping layer 906 may be formed by CVD, ALD, or other suitable processes.

In FIG. 11D, a dielectric layer 908 is formed on the capping layer 906. In some embodiments, the dielectric layer 908 may include metal oxide, metal nitride, or other suitable materials. In some embodiments, the dielectric layer 908 may be formed by thermal ALD, or other suitable processes. In some embodiments, the dielectric layer 908 may be formed by DoM selective deposition. Before forming the dielectric layer 908, a blocking layer similar to the blocking layer 328 as shown in FIG. 3G may be formed on the gap fill layer 902. Because of the function group of the blocking layer prevents dielectric material from adhering to the blocking layer. The dielectric layer 908 is formed only on the capping layer 906. In some embodiments, the dielectric layer 906 may prevent damage to the underneath layers, such as the capping layer 906, the first conductive feature 724, and the second conductive feature 726, during subsequent processing steps.

Figure 11E:
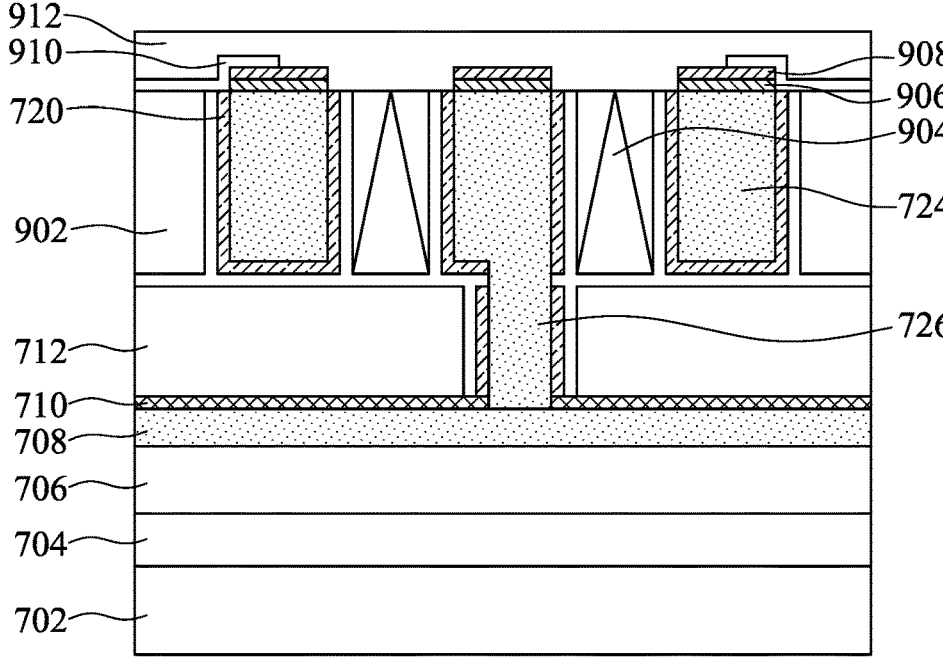

As shown in FIG. 11E, the blocking layer (if present) is removed and an ESL 910 is conformally formed over the dielectric layer 902, the liner layer 721, the barrier layer 720, and the dielectric layer 908. In some embodiments, the ESL 910 may be formed by PVD, CVD, PECVD, ALD, plasma enhanced ALD (PEALD), or other suitable processes. In some embodiments, the ESL 910 may include silicon oxycarbide, silicon carbon nitride, silicon nitride, silicon carbon oxynitride, silicon dioxide, silicon carbide, silicon oxynitride, aluminum nitride, aluminum oxynitride, aluminum oxide, another dielectric material, or other suitable materials. In some embodiments, the ESL 910 may have a thickness between about 5 Angstroms and about 200 Angstroms.

In FIG. 11E, a portion of the ESL 910 is removed to expose portions of the dielectric layer 908 on the capping layer 906 and portions of the dielectric layer 902. A dielectric layer 912 is formed on the remaining ESL 910, the exposed dielectric layer 908 on the capping layer 906, and the exposed portions of dielectric layer 902. Similar to the structures as shown in FIG. 7K, two of multiple metallization layers, including the $M_x$ and $M_{x+1}$, are illustrated in FIG. 10E. The $M_x$ metallization layer includes the ESL 910, the second conductive feature 726, the low-k dielectric layer 712 through which the second conductive feature 726 extends to connect with the conductive layer 708, the first conductive feature 724, the gap fill layer 902 through which both the first and second conductive features 724 and 726 extend through, and the second conductive feature 726. The $M_{x+1}$ metallization layer includes the liner layer 721, barrier layer 720, the capping layer 906, the dielectric layer 908, the ESL 910, the low-k dielectric layer 921, and conductive structures to be formed in subsequent processes. In some embodiment, similar metallization processes for forming the $M_x$ and $M_{x+1}$ may be repeatedly performed until a top metallization layer is formed. As the gap fill layer 902 has not been damaged by etching or patterning process, the original low dielectric constant of the gap fill layer 902 remains unchanged. Therefore, the capacitance of the metallization of the $M_x$ metallization layer is not increased to cause high RC delay. The damage-free low-k gap filling layer 902 further improves the reliability, such as the time-dependent dielectric breakdown (TDDB) and voltage breakdown (VBD) of the semiconductor device 700. The air gaps 904 further reduces the capacitance of the metallization structure and subsequently shortens the RC delay.

An interconnection structure is provided according to one embodiment. The interconnection structure includes an etching-process-free first dielectric layer, a first conductive structure extending within the first dielectric layer, a second dielectric layer formed under the first dielectric layer, and a second conductive structure extending through both the first dielectric layer and the second conductive layer. The first dielectric layer may be a layer of dry air. Alternatively, the first dielectric layer may include a low-k dielectric layer made of porous SiCOH, BN, or BC. In some embodiment, the low-k dielectric layer may include air gap therein.

The first dielectric layer may be formed by flowable low-dielectric deposition, flowable oxide deposition, spin on dielectric process, or atomic layer deposition (ALD). In other embodiments, the first dielectric structure includes an air gap between a pair of adjacent first conductive structure and second conductive structure by using plasma enhanced chemical vapor deposition (PECVD). In some embodiment, the first dielectric layer may an air gap therein if the aspect ratio of the first dielectric layer is smaller than a predetermined value. The first dielectric layer may be formed after the first conductive structure and the second conductive structures have been formed. The first conductive structure includes conductive wires made of Cu, Al, CuAl, Ru, Mo, W, or an alloy thereof.

The second dielectric layer is formed of a low-k dielectric selected from SiCOH, BM, or BC. The second dielectric layer may be formed by PECVD, ALD, or PVD. The second conductive structure includes a conductive contact made of Cu, Al, CuAl, Ru, Mo, W, or an alloy thereof. The second conductive structure includes a conductive contact for interconnect conductive layers formed at different levels.

A semiconductor device comprising a plurality of metallization layers. At least one of the metallization layers comprises a first dielectric layer, a first conductive structure, a second dielectric layer, and a second conductive structure. The first conductive structure may extend horizontally within the first dielectric layer, while the second conductive structure may extend vertically through the first dielectric layer and second dielectric layer. The first dielectric layer is formed within a gap between the first conductive layer and the second conductive layer without being subjected to an etching process. The first dielectric layer may include an air gap formed therein. The first dielectric layer may be a layer of dry air.

A method of forming an interconnection structure is provided. The method includes forming a second dielectric layer over a substrate, forming a sacrificial dielectric layer on the second dielectric layer, forming a plurality of first openings extending through sacrificial dielectric layer, and extending at least one of the first openings further through the second dielectric layer to form a second opening. The first opening and the second opening are then filled with conductive material to form a first conductive structure and a second conductive structure, respectively. The sacrificial dielectric layer remained in gaps between the first and second conductive structures is then removed, and the gaps are filled with dielectric materials. The method may further comprise forming a conformal barrier before forming the first and the second conductive structures, forming an etch stop layer to cover at least portions of the first conductive structure; and forming a conductive layer over the etch stop layer. After removing the sacrificial dielectric layer, the gaps may be filled with dielectric materials with a dielectric constant smaller than a predetermined value. The gaps may also be partially or completely filled with dry air.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of forming an interconnection structure, comprising:

forming a dielectric layer over a substrate;

forming a sacrificial dielectric layer over the dielectric layer;

forming a plurality of first openings extending through the sacrificial dielectric layer;

extending at least one of the first openings further through the dielectric layer to form a second opening, thereby defining the dielectric layer as a second dielectric layer;

after forming the second opening, forming a conformal barrier and a blocking layer at a bottom of the second opening;

removing the blocking layer;

filling the first openings and the second opening with conductive material to simultaneously form a plurality of first conductive structures within the sacrificial dielectric layer and a second conductive structure extending through the sacrificial dielectric layer and the second dielectric layer, respectively;

removing the sacrificial dielectric layer remaining in gaps between the first and second conductive structures;

filling the gaps with a dielectric material conformally around the first conductive structures and the second conductive structure without subjecting the dielectric material to an etching process, thereby forming a first dielectric layer positioned above the second dielectric layer;

forming an etch stop layer to cover at least portions of the first conductive structure; and forming a conductive layer over the etch stop layer.

2. The method of claim 1, further comprising filling the gaps with dielectric materials with a dielectric constant smaller than a predetermined value for the first dielectric layer.

3. The method of claim 1, further comprising filling the gaps partially or completely with air to form air gaps in the first dielectric layer.

4. The method of claim 1, further comprising:

forming a liner layer on sidewalls and bottoms of the first openings, on sidewalls of the second opening, and on the blocking layer before forming the conformal barrier, wherein the liner layer comprises silicon nitride, silicon carbon nitride, or silicon oxycarbonitride, and wherein removing the blocking layer also removes portions of the liner layer and the conformal barrier disposed on the blocking layer, such that the second conductive structure directly contacts an underlying conductive layer.

5. The method of claim 1, further comprising:

after filling the gaps with the dielectric material, planarizing the dielectric material to expose top surfaces of the first conductive structures and the second conductive structure;

performing a pretreatment to clean the exposed top surfaces; and selectively forming a capping layer on the exposed top surfaces of the first conductive structures and the second conductive structure, wherein the capping layer comprises cobalt.

6. A method of forming an interconnection structure, comprising:

forming a plurality of metallization layers over a substrate, wherein forming at least one metallization layer of the plurality of metallization layers comprises:

forming a dielectric layer over an underlying metallization layer or the substrate;

forming a sacrificial dielectric layer over the dielectric layer;

forming a plurality of first openings extending through the sacrificial dielectric layer;

extending at least one of the first openings through the dielectric layer to form a second opening configured to interconnect with the underlying metallization layer, thereby defining the dielectric layer as a second dielectric layer;

filling the first openings and the second opening with a conductive material to simultaneously form a plurality of first conductive structures within the sacrificial dielectric layer and a second conductive structure extending vertically through the sacrificial dielectric layer and the second dielectric layer to the underlying metallization layer;

removing the sacrificial dielectric layer to form gaps between the first conductive structures and the second conductive structure; and filling the gaps with an etching-process-free dielectric material conformally around the first conductive structures and the second conductive structure without subjecting the dielectric material to an etching process, thereby forming a first dielectric layer positioned above the second dielectric layer, wherein the etching-process-free dielectric material forms the first dielectric layer comprising air gaps selectively formed in spaces between adjacent first conductive structures where a pitch is smaller than a predetermined value.

7. The method of claim 6, wherein filling the gaps with the etching-process-free dielectric material to form the first dielectric layer comprises depositing the dielectric material by plasma-enhanced chemical vapor deposition (PECVD) after removing the sacrificial dielectric layer.

8. The method of claim 6, further comprising:

forming a barrier layer on sidewalls and bottoms of the first openings and the second opening prior to filling with the conductive material.

9. The method of claim 6, wherein removing the sacrificial dielectric layer comprises performing a selective ashing process to decompose the sacrificial dielectric layer while protecting the first conductive structures and the second conductive structure with a photoresist mask.

10. The method of claim 6, wherein the second conductive structure comprises a conductive via electrically connecting the at least one metallization layer to the underlying metallization layer, and wherein the conductive material is electroplated into the first openings and the second opening.

11. The method of claim 6, wherein the etching-process-free dielectric material for the first dielectric layer has a dielectric constant lower than that of the second dielectric layer.

12. The method of claim 6, further comprising:

forming a second blocking layer on the dielectric material after planarizing;

selectively forming a second dielectric layer on the capping layer, wherein the second dielectric layer comprises a metal oxide or metal nitride;

removing the second blocking layer;

conformally forming an etch stop layer over the dielectric material, the second dielectric layer, and sidewalls of the first conductive structures and the second conductive structure; and removing portions of the etch stop layer to expose portions of the second dielectric layer and the dielectric material.

13. A method of forming an interconnection structure, comprising:

forming a lower conductive layer within a first dielectric layer over a substrate;

forming an inter-level dielectric layer over the first dielectric layer;

forming a conductive via through the inter-level dielectric layer to electrically connect the lower conductive layer and an upper conductive layer;

forming a sacrificial dielectric layer surrounding the conductive via and the upper conductive layer;

removing the sacrificial dielectric layer after forming the conductive via and upper conductive layer;

annealing the interconnection structure to seal exposed surfaces of the conductive via and the upper conductive feature; and filling regions created as a result of removal of the sacrificial dielectric layer with an etching-process-free dielectric material.

14. The method of claim 13, wherein the etching-process-free dielectric material is deposited by a flowable-oxide, spin-on-dielectric, or atomic-layer-deposition process.

15. The method of claim 13, wherein the etching-process-free dielectric material comprises a porous SiCOH, BN, or BC material having a dielectric constant lower than 2.5.

16. The method of claim 13, wherein the etching-process-free dielectric material comprises a carbon-rich polymer removable by an oxygen-based plasma or solvent exposure process.

17. The method of claim 13, wherein the inter-level dielectric layer is formed by plasma-enhanced chemical-vapor deposition (PECVD).

18. The method of claim 13, wherein the conductive via and the upper conductive feature are simultaneously filled in a dual-damascene process prior to removal of the sacrificial dielectric layer.

19. The method of claim 13, wherein the etching-process-free dielectric material comprises an air-gap region formed between adjacent conductive features in the upper conductive layer.

20. The method of claim 13, further comprising:
  planarizing an upper surface of the etching-process-free dielectric to expose the upper conductive feature prior to forming a subsequent metallization level.

\* \* \* \* \*